United States Patent
Sakui

(10) Patent No.: US 9,070,470 B1
(45) Date of Patent: Jun. 30, 2015

(54) SENSING MEMORY CELLS COUPLED TO DIFFERENT ACCESS LINES IN DIFFERENT BLOCKS OF MEMORY CELLS

(71) Applicant: Micron Technology, Inc., Boise, ID (US)

(72) Inventor: Koji Sakui, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/102,587

(22) Filed: Dec. 11, 2013

(51) Int. Cl.
*G11C 16/06* (2006.01)
*G11C 16/26* (2006.01)
*G11C 16/10* (2006.01)

(52) U.S. Cl.
CPC ............... *G11C 16/26* (2013.01); *G11C 16/10* (2013.01)

(58) Field of Classification Search
CPC ............. G11C 16/102; G11C 11/5621; G11C 11/5628; G11C 16/04; G11C 16/10; G11C 16/105; G11C 16/34
USPC ................. 365/185.03, 185.09, 185.22, 149, 365/185.08, 189.05, 207
See application file for complete search history.

(56) References Cited

U.S. PATENT DOCUMENTS

| 5,418,752 A | 5/1995 | Harari et al. |
| 6,097,666 A | 8/2000 | Sakui et al. |
| 7,450,422 B2 | 11/2008 | Roohparvar |
| 2013/0135919 A1* | 5/2013 | Hamada ........................ 365/148 |

* cited by examiner

*Primary Examiner* — Thong Q Le
(74) *Attorney, Agent, or Firm* — Dicke, Billig & Czaja, PLLC

(57) ABSTRACT

In an embodiment, a target memory cell in a first block of memory cells of a memory device and a target memory cell in a second block of memory cells of the memory device are sensed concurrently while a read voltage is applied to a selected access line coupled to the target memory cell in the first block of memory cells and while a read voltage is applied to another selected access line coupled to the target memory cell in the second block of memory cells.

47 Claims, 12 Drawing Sheets

US 9,070,470 B1

SENSING MEMORY CELLS COUPLED TO DIFFERENT ACCESS LINES IN DIFFERENT BLOCKS OF MEMORY CELLS

FIELD

The present disclosure relates generally to, memory and, in particular, the present disclosure relates to sensing memory cells coupled to different data lines in different blocks of memory cells.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A flash memory device might include a memory array having a plurality of blocks of memory cells, e.g., sometimes called memory blocks. For example, data might be read from a memory array one memory block at time. Data might also be programmed into a memory array one memory block at a time. Sometimes, for example, a block of memory cells might be a plurality of memory cells that might be erased at once.

A memory block might have a physical block address that denotes the physical location of the memory block within the memory array, for example. A memory block might be addressed by a logical block address received from device that is external to the memory device, such as an external controller, e.g., sometimes called a host controller. The memory device, for example, might be configured to translate the logical block address into the physical block address of the memory block.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select transistors, e.g., a source select transistor and a drain select transistor. Each source select transistor is connected to a source line, while each drain select transistor is connected to a data line, such as column bit line. A "column" refers to a group of memory cells that are commonly coupled to a local data line, such as a local bit line. It does not require any particular orientation or linear relationship, but instead refers to the logical relationship between memory cell and data line. Note, for example, that for an array having a plurality of memory blocks, a string of memory cells of each memory block might be selectively coupled to a common data line through a drain select transistor.

For the reasons stated above, and for other reasons stated below which will become apparent to those skilled in the art upon reading and understanding the present specification, there is a need in the art for alternatives to existing methods of reading and/or programming memory blocks.

DETAILED DESCRIPTION

Figure 1:
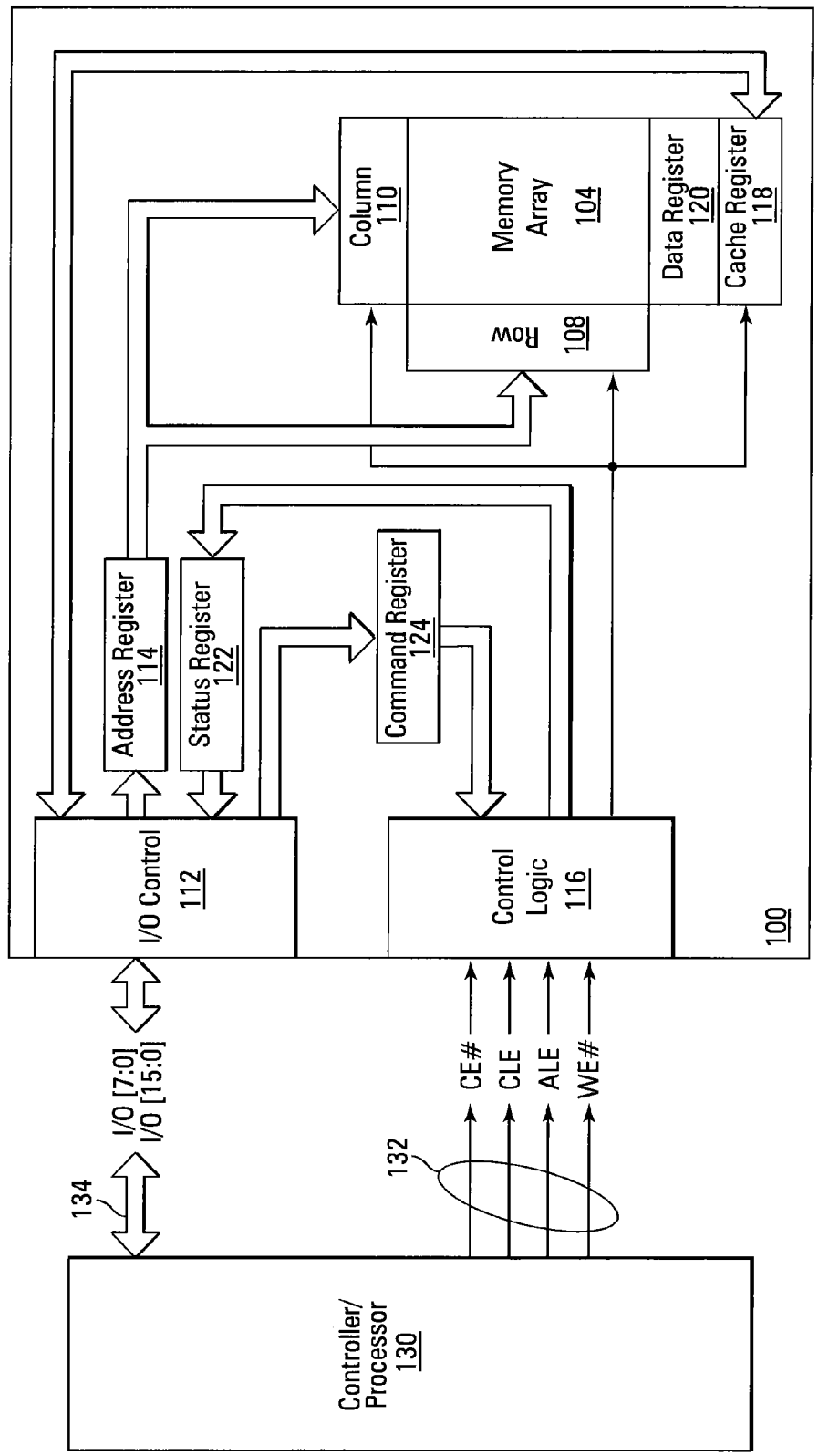
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 is a simplified block diagram of an electronic device, e.g., an integrated circuit device, such a memory device 100, in communication with a controller 130, such as a memory controller, e.g. a host controller, as part of an electronic system, according to an embodiment. Memory device 100 might be a NAND flash memory device, for example.

Controller 130 might include a processor, for example. Controller 130 might be coupled to host, for example, and may receive command signals (or commands), address signals (or addresses), and data signals (or data) from the host and may output data to the host.

Memory device 100 includes an array of memory cells 104. Memory array 104 may be a quasi-two-dimensional (e.g. "two-dimensional") array. For example, a quasi-two-dimensional array might include memory cells (e.g., series-coupled strings of memory cells) over a surface of a semiconductor, where the surface of the semiconductor lies substantially in a single plane. For example, an array may be considered to be quasi-two dimensional when the memory cells are formed in substantially a single plane, such as a substantially horizontal plane, over a semiconductor, e.g., a planar semiconductor.

As another example, memory array 104 may be a stacked memory array, e.g., often referred to as three-dimensional memory array. For example, one type of three-dimensional memory array might include a plurality of stacked quasi-two-dimensional arrays. Another type of three-dimensional memory array might include pillars of stacked memory elements, such as vertical series-coupled strings of memory cells, e.g., NAND strings.

A row decoder 108 and a column decoder 110 might be provided to decode address signals. Address signals are received and decoded to access memory array 104.

Memory device 100 may also include input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116, to latch incoming commands. Control logic 116 controls access to the memory array 104 in response to the commands and generates status information for the external controller 130. The control logic 116 is in communication with row decoder 108 and column decoder 110 to control the row decoder 108 and column decoder 110 in response to the addresses.

Control logic 116 can be included in controller 130. Controller 130 can include, other circuitry, firmware, software, or the like, whether alone or in combination. Controller 130 can be an external controller (e.g., in a separate die from the memory array 104, whether wholly or in part) or an internal controller (e.g., included in a same die as the memory array 104).

Controller 130 may be configured to cause memory device 100 to perform the methods disclosed herein. For example, controller 130 may be configured to cause memory device 100 to sense a target memory cell in a first block of memory cells of memory array 104 and a target memory cell in a second block of memory cells of memory array 104 concurrently while a read voltage is being applied to a selected access line coupled to the target memory cell in the first block of memory cells and while a read voltage is being applied to another selected access line coupled to the target memory cell in the second block of memory cells. As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to controller 130 and subsequent output to a host; then new data is passed from the data register 120 to the cache register 118. A status register 122 is in communication with I/O control circuitry 112 and control logic 116 to latch the status information for output to the controller 130.

Memory device 100 receives control signals at control logic 116 from controller 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from controller 130 over a multiplexed input/output (I/O) bus 134 and outputs data to controller 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
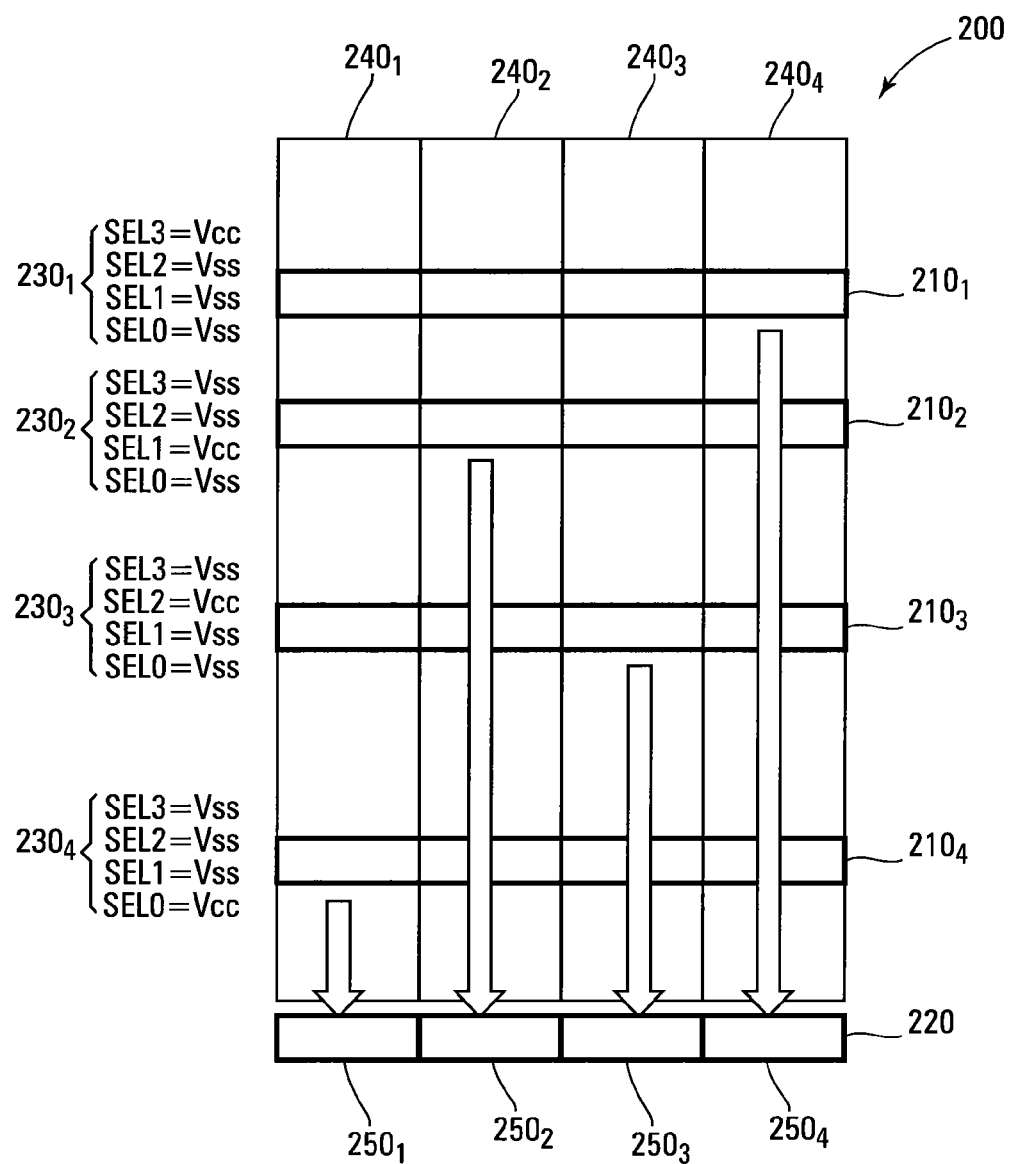
FIG. 2 is a block diagram illustrating reading portions of different blocks of a memory array, according to another embodiment.

FIG. 2 is a block diagram illustrating a memory array 200, during a read operation. Memory array 200 may be a portion of the memory array 104 of the memory device 100 in FIG. 1. Memory array 200 may have a plurality of memory blocks 210, e.g., including memory blocks $210_1$ to $210_4$.

Figure 3:
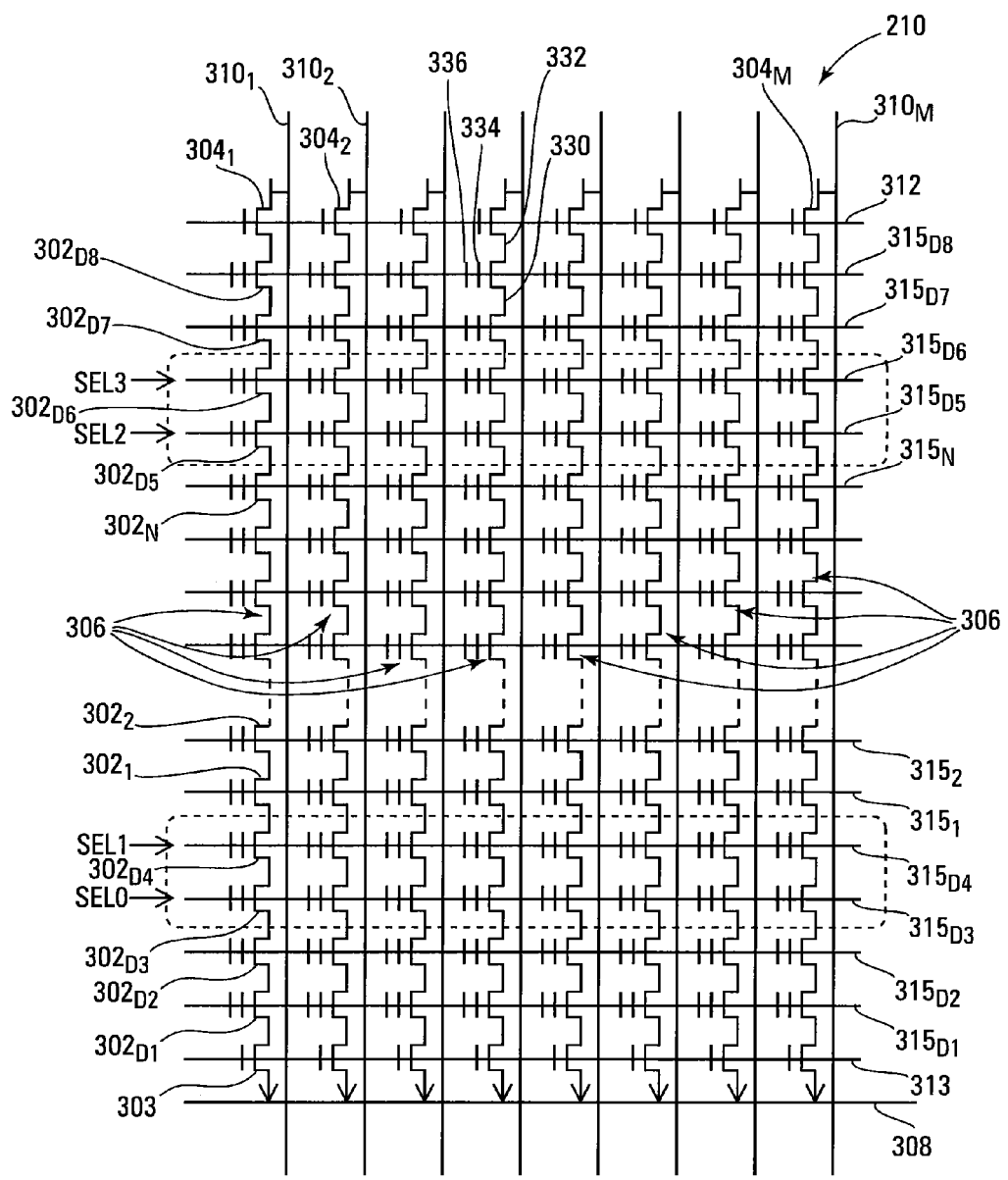
FIG. 3 is a schematic diagram of a memory block, according to another embodiment.

FIG. 3 is a schematic diagram of one such memory block 210, e.g., configured as a NAND memory block. Memory block 210 may include a plurality of memory cells 302, such as nonvolatile memory cells, between a select transistor 303, such as a source select transistor, and a select transistor 304, such as a drain select transistor.

For example, each of a plurality of strings 306 of series-coupled memory cells 302, coupled source to drain, might be between and in series with a select transistor 303 and select transistor 304, where a select transistor 303 is configured to selectively couple a string 306 to a source 308 and a select transistor 304 is configured to selectively couple that string 306 to a data line, such as a bit line 310, e.g., a respective one of bit lines $310_1$ to $310_M$. For example, select transistors $304_1$ to $304_M$ might be configured to respectively couple a string 306 to bit lines $310_1$ to $310_M$.

Each of the plurality of strings 306 might include memory cells $302_{D1}$ to $302_{D4}$, $302_1$ to $302_N$, and $302_{D5}$ to $302_{D8}$, for example. Note that each bit line 310 may be commonly coupled to a select transistor 304 coupled to a string 306 in each of the memory blocks 210. While the subsequent discussions predominately refer to NAND memory devices, the present embodiments are not limited to NAND memory devices, but can be used in other memory devices as well.

Select transistors 304 (e.g., select transistors $304_1$ to $304_M$) might have control gates commonly coupled to a select line 312, such as a drain select line, while select transistors 303 might have control gates commonly coupled to a select line 313, such as a source select line. For example, the select transistors 304 commonly coupled to select line 312 might form a row of select gates 304, and the select transistors 303 commonly coupled to select line 313 might form a row of select gates 303.

The memory cells 302 in each of strings 306 may have control gates respectively coupled to access lines, such as word lines 315. For example, the memory cells $302_{D1}$ to $302_{D4}$, $302_1$ to $302_N$, and $302_{D5}$ to $302_{D8}$ in each string 306 might be respectively coupled to word lines $315_{D1}$ to $315_{D4}$, $315_1$ to $315_N$, and $315_{D5}$ to $315_{D8}$.

Word lines $315_{D1}$ to $315_{D4}$ and $315_{D5}$ to $315_{D8}$ might be dummy word lines, and the memory cells $302_{D1}$ to $302_{D4}$ and $302_{D5}$ to $302_{D8}$ respectively coupled to dummy word lines $315_{D1}$ to $315_{D4}$ and $315_{D5}$ to $315_{D8}$ might be dummy memory cells, e.g., that are not used for the storage of user data (e.g., from a host device) and/or ECC. However, memory cells $302_1$ to $302_N$ may be used to (e.g., configured to) store user data and the ECC for that user data. For example, memory cells $302_1$ to $302_N$ might be referred to as data-storage memory cells $302_1$ to $302_N$ to differentiate them from the dummy memory cells $302_{D1}$ to $302_{D4}$ and $302_{D5}$ to $302_{D8}$. For some embodiments, the memory cells 302 commonly coupled to a word line 315 might be referred to as a row of memory cells, while those memory cells coupled to a bit line might be referred to as a column of memory cells.

A row of memory cells 302 can, but need not include all memory cells 302 commonly coupled to a word line 315. Rows of memory cells 302 often include every other memory cell 302 commonly coupled to a given word line 315. For example, memory cells 302 commonly coupled to a word line 315 and selectively coupled to even bit lines 310 (e.g., bit lines $310_2$, $310_4$, $310_6$, etc.) may be one row of memory cells 302 (e.g., even memory cells), while memory cells 302 commonly coupled to that word line 315 and selectively coupled to odd bit lines 304 (e.g., bit lines $310_1$, $310_3$, $310_5$, etc.) may be another row of memory cells 302 (e.g., odd memory cells). Although bit lines $310_2$-$310_6$ are not expressly depicted in FIG. 3, it is apparent from the figure that the bit lines 310 may be numbered consecutively from bit line $310_1$ to bit line $310_M$. Other groupings of memory cells 302 commonly coupled to a word line 315 may also define a row of memory cells 302. For certain memory devices, all memory cells commonly coupled to a given word line might be deemed a physical row, while those portions of the physical row that are read during a single read operation or programmed during a single program operation (e.g., even or odd memory cells) might be deemed a logical row, sometimes referred to as a page.

Typical construction of a memory cell 302 includes a source 330 and a drain 332, a charge-storage structure 334 (e.g., a floating gate, charge trap, etc.) that can store a charge that determines a data value of the cell, and a control gate 336. The control gates 336 might be coupled to (and in some cases might form a portion of) a word line 315.

Data-storage memory cells $302_1$ to $302_N$ might be programmed as single-level memory cells or multiple-level memory cells. The dummy memory cells $302_{D3}$, $302_{D4}$, $302_{D5}$, and $302_{D6}$, respectively commonly coupled to dummy word lines $315_{D3}$, $315_{D4}$, $315_{D5}$, and $315_{D6}$ might be used as (e.g., configured to be used as) selector memory cells and might be programmed for selecting particular groupings of data-storage memory cells, commonly coupled to a word line selected for reading, for output, e.g., to a page buffer, such as page buffer 220 in FIG. 2 that might be a portion of the data register 120 in FIG. 1. For example, dummy memory cells $302_{D3}$, $302_{D4}$, $302_{D5}$, and $302_{D6}$ may be referred to as selector memory cells $302_{D3}$, $302_{D4}$, $302_{D5}$, and $302_{D6}$, and the dummy access lines (e.g., the dummy word lines $315_{D3}$, $315_{D4}$, $315_{D5}$, and $315_{D6}$) respectively commonly coupled to selector memory cells $302_{D3}$, $302_{D4}$, $302_{D5}$, and $302_{D6}$ may be referred to as selector access lines (e.g., selector word lines).

Each string 306 might include a pair of selector memory cells coupled in series to either end of the portion of the string 306 (e.g., data-storage memory cells $302_1$ to $302_N$) used for storing data. For example, series-coupled selector memory cells $302_{D3}$ and $302_{D4}$ might be coupled in series with memory cell $302_1$ and series-coupled selector memory cells $302_{D5}$ and $302_{D6}$ might be coupled in series with memory cell $302_N$. A pair of series-coupled dummy memory cells $302_{D1}$ and $302_{D2}$ might be between and coupled in series with select transistor 303 and the pair of series-coupled selector memory cells $302_{D3}$ and $302_{D4}$, and the pair of series-coupled dummy memory cells $302_{D7}$ and $302_{D8}$ might be between and coupled in series with select transistor 304 and the pair of series-coupled selector memory cells $302_{D5}$ and $302_{D6}$.

A pair of selector access lines (e.g., selector word lines $315_{D3}$ and $315_{D4}$) might be between the word line $315_1$ commonly coupled to a row of data-storage memory cells $302_1$ and dummy word line $315_{D2}$. Dummy word line $315_{D1}$ might be between dummy word line $315_{D2}$ and select line 313. A pair of selector access lines (e.g., selector word lines $315_{D5}$ and $315_{D6}$) might be between the word line $315_N$ commonly coupled to a row of data-storage memory cells $302_N$ and dummy word line $315_{D7}$. Dummy word line $315_{D8}$ might be between dummy word line $315_{D7}$ and select line 312.

A pair of rows of selector memory cells (e.g., the rows of selector memory cells $302_{D3}$ and selector memory cells $302_{D4}$) might be between the row of data-storage memory cells $302_1$ and the row of dummy memory cells $302_{D2}$. The row of dummy memory cells $302_{D1}$ might be between the row of dummy memory cells $302_{D2}$ and the row of select transistors 303 commonly coupled to select line 313. A pair of rows of selector memory cells (e.g., the rows of selector memory cells $302_{D5}$ and selector memory cells $302_{D6}$) might be between the row of data-storage memory cells $302_N$ and the row of dummy memory cells $302_{D7}$. The row of dummy memory cells $302_{D8}$ might be between the row of dummy memory cells $302_{D7}$ and the row of select transistors 304 commonly coupled to select line 312.

A select transistor 304 coupled to a string 306 of memory cells in each of memory blocks $210_1$ to $210_4$ might be coupled to the same bit line 310. For example, select transistor $304_1$ in each of memory blocks $210_1$ to $210_4$ may be configured to selectively couple a string 306 in a respective one of memory blocks $210_1$ to $210_4$ to bit line $310_1$; select transistor $304_2$ in each of memory blocks $210_1$ to $210_4$ may be configured to selectively couple a string 306 in a respective one of memory blocks $210_1$ to $210_4$ to bit line $310_2$, . . . and select transistor $304_M$ in each of memory blocks $210_1$ to $210_4$ may be configured to selectively couple a string 306 in a respective one of memory blocks $210_1$ to $210_4$ to bit line $310_M$. That is, a string 306 in each of memory blocks $210_1$ to $210_4$ may be selectively coupled to the same bit line 310, for example.

Figure 4:
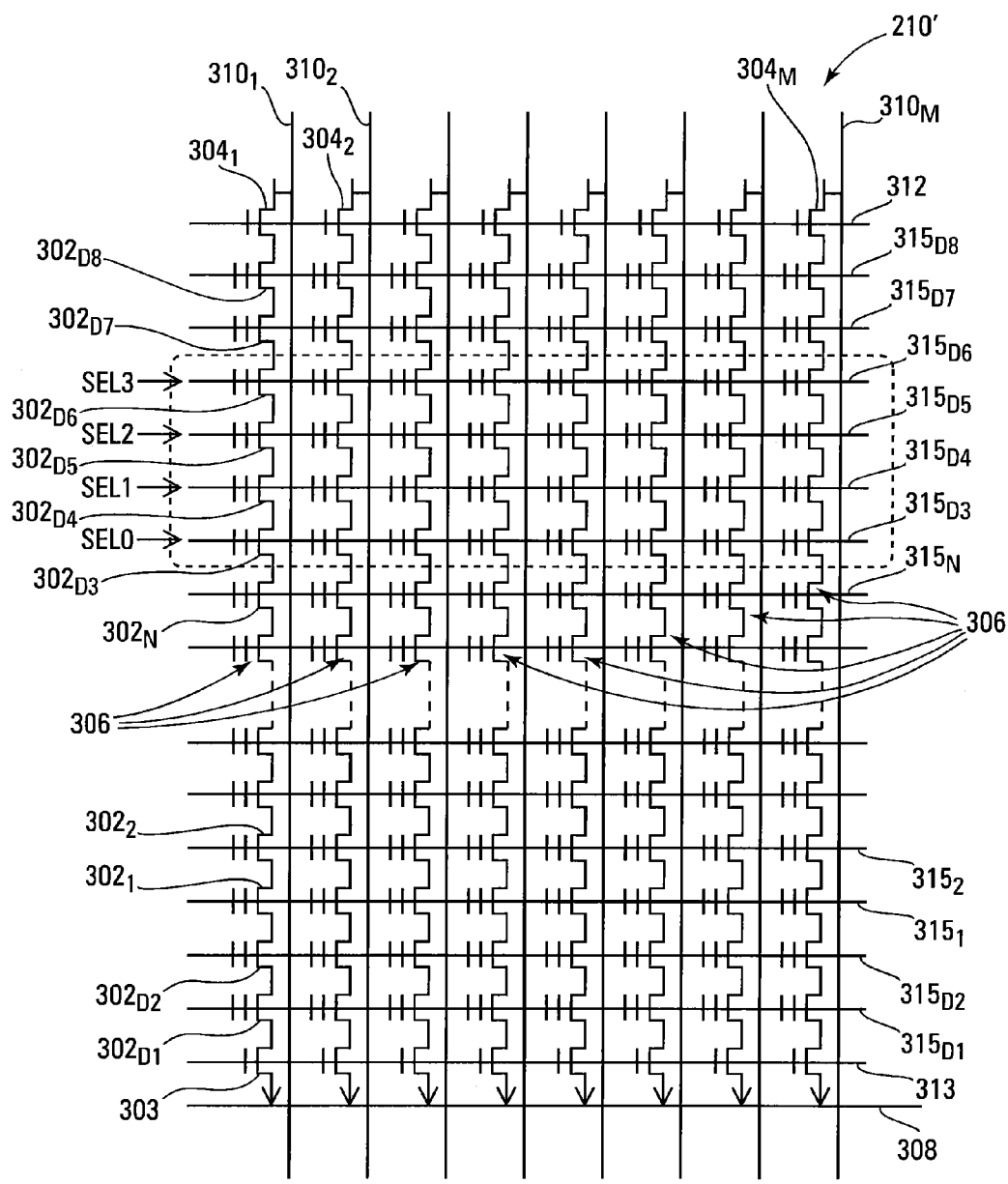
FIG. 4 is a schematic diagram of a memory block, according to another embodiment.

FIG. 4 is a schematic diagram of a memory block 210', e.g., configured as a NAND memory block, according to another embodiment. For some embodiments, each of the memory blocks $210_1$ to $210_4$ in FIG. 2 might be configured as memory block 210'. Common numbering is used in FIGS. 3 and 4 to denote similar (e.g., the same) components, e.g., where the commonly numbered components may be as described above in conjunction with FIG. 3.

In FIG. 4, the rows of selector memory cells $302_{D3}$ and selector memory cells $302_{D4}$ are between the row of data-storage memory cells $302_N$ and the row of selector memory cells $302_{D5}$, so that four rows, e.g. the rows of selector memory cells $302_{D3}$ to $302_{D6}$, are between the row of data-storage memory cells $302_N$ and the row of dummy memory cells $302_{D7}$. For example, each string 306 includes selector memory cells $302_{D3}$ to $302_{D6}$ between a data-storage memory cell $302_N$ and a dummy memory cell $302_{D7}$. That is, four selector access lines (e.g., selector word lines $315_{D3}$ to $315_{D6}$) might be between the word line $315_N$ commonly coupled to a row of data-storage memory cells $302_N$ and the dummy word line $315_{D7}$, for example.

Note that in each string 306 in FIG. 4, all of the selector memory cells (e.g., selector memory cells $302_{D3}$ to $302_{D6}$) are now on the data-line (e.g., bit-line) side of the data-storage memory cells (e.g., data-storage memory cells $302_1$ to $302_N$) between the data-storage memory cell $302_N$ and a select transistor 304 and that only the dummy memory cells $302_{D1}$ to $302_{D2}$ that are not used as selector memory cells are on the source side of the data-storage memory cells between the data-storage memory cell $302_1$ and a select transistor 303. This acts to reduce the program disturb that might otherwise occur to data-storage memory cell $302_1$ when programming selector memory cells $302_{D3}$ and $302_{D4}$, when selector memory cells $302_{D3}$ and $302_{D4}$ are on the source side of data-storage memory cell $302_1$, as shown in FIG. 3, in situations when programming proceeds from the bit-line end of a string toward the source-line end.

For some embodiments, the voltages SEL0 to SEL3 are respectively applied to selector word lines $315_{D3}$ to $315_{D6}$, e.g., during a read operation or a programming operation, as shown in FIGS. 3 and 4. For example, the voltages SEL0 to SEL3 might be either a voltage, such as Vcc, that is greater than the threshold voltage of a programmed selector memory cell (e.g., assigned a logic zero) or a voltage, such as Vss, that is less than the threshold voltage of a programmed selector memory cell and greater than the threshold voltage of an erased selector memory cell (e.g., assigned a logic one).

The sets 230 of voltages SEL0 to SEL3 that might be applied to the memory blocks 210 are shown in FIG. 2. For example, sets $230_1$ to $230_4$ of voltages SEL0 to SEL3 might be respectively applied to memory blocks $210_1$ to $210_4$.

Each block 210 might be divided into a plurality of portions 240 (e.g., portions $240_1$ to $240_4$) in the row direction, for example, as shown in FIG. 2. For example, each of the rows of memory cells 302 in FIGS. 3 and 4 might be divided into the portions $240_1$ to $240_4$. For example, each portion 240 of a row might store four kilobytes of user data and the ECC associated with that user data. Each of the portions 240 might have the same size, e.g., each portion 240 of a row might store the same amount of user data and ECC. Alternatively, at least one portion 240 of the plurality of portions 240 might have a different size than the remaining portions 240 of the plurality of portions 240.

Figure 5A:
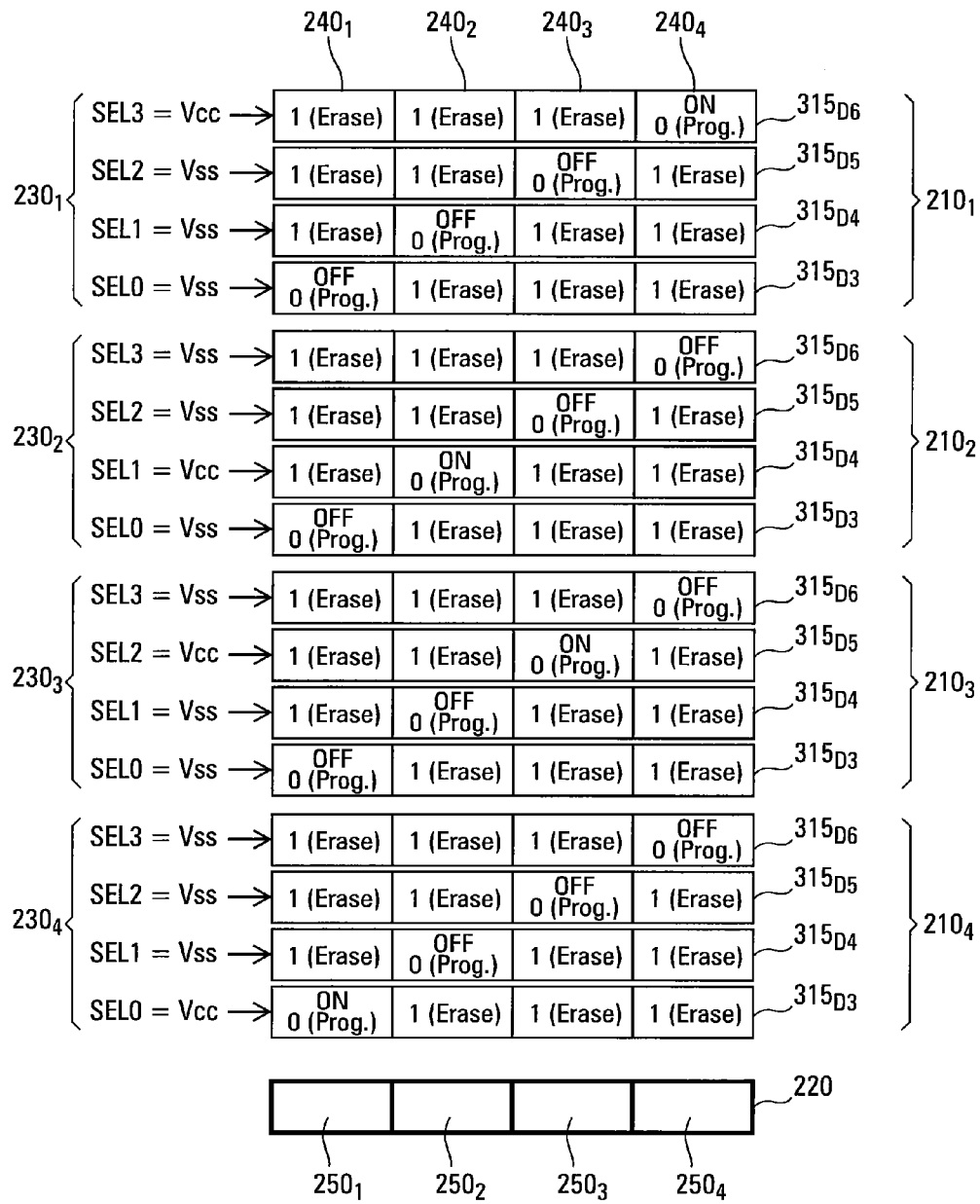
FIG. 5A is a block diagram illustrating the states of selector memory cells in different blocks of a memory array, according to another embodiment.

Data read from portions $240_1$ to $240_4$ may be respectively output to (e.g., sensed by) portions $250_1$ to $250_4$ of page buffer 220. For example, for some embodiments, portions $250_1$ to $250_4$ might sense data concurrently. Data read from portion $240_1$ of memory block $210_4$, portion $240_2$ of memory block $210_2$, portion $240_3$ of memory block $210_3$, and portion $240_1$ of memory block $210_4$ might be respectively output to (e.g., sensed by) portions $250_1$, $250_2$, $250_3$, and $250_4$ of page buffer 220 concurrently. This may be facilitated by programming the rows of selector memory cells as shown in FIG. 5A. Each portion 250 might sense a certain amount of data, e.g., four kilobytes of user data plus the ECC for that user data.

During a read operation, a read voltage might be applied to a selected word line 315, such as selected word line $315_1$, in a memory block 210. For example, target memory cells $302_1$ targeted for reading might be commonly coupled to selected word line $315_1$ in each of blocks 210. Untargeted memory cells $302_1$ not targeted for reading might also be commonly coupled to selected word line $315_1$, for example. That is, for example, the target memory cells $302_1$ might be in portions $240_4$, $240_2$, $240_3$, and $240_1$ respectively in blocks $210_1$, $210_2$, $210_3$, and $210_4$. The untargeted memory cells $302_1$, however, might be in portions $240_1$ to $240_3$ in block $210_1$, portions $240_1$, $240_3$, and $240_4$ in block $210_2$, portions $240_1$, $240_2$, and $240_4$ in block $210_3$, and portions $240_2$ to $240_4$ in block $210_4$.

While the read voltage is applied to selected word line $315_1$ in each of blocks 210, a pass voltage might be applied to unselected word lines $315_{D1}$, $315_{D2}$, $315_{D7}$, $315_{D8}$, and $315_2$ to $315_N$ in a block 210. A row of select transistors 304 commonly coupled to a select line 312 in each of blocks 210 may be activated (e.g., turned on) by applying an activation voltage, such as Vcc, to the select line in each of blocks 210 while the pass voltage and the read voltage is applied to each of the blocks 210. When the read voltage is greater than a read threshold voltage of a memory cell that memory cell is activated (e.g., becomes conductive), whereas when the read voltage is less than the read threshold voltage of a memory cell that memory cell remains deactivated (e.g., remains non-conducting), e.g., off.

FIG. 5A is a block diagram illustrating the states of the selector memory cells in the rows of selector memory cells in each of the memory blocks $210_1$ to $210_4$ respectively coupled to selector word lines $315_{D3}$ to $315_{D6}$ in each of the memory blocks $210_1$ to $210_4$. Page buffer 220, including the portions $250_1$ to $250_4$ respectively corresponding to the portions $240_1$ to $240_4$ of each of the rows of selector memory cells respectively applied to the selector word lines $315_{D3}$ to $315_{D6}$, is also shown in FIG. 5A.

The voltages SEL0 to SEL3 that might be respectively applied to the selector word lines $315_{D3}$ to $315_{D6}$ in each of the memory blocks 210 are also shown in FIG. 5A. The voltages SEL0 to SEL3 respectively applied to the selector word lines $315_{D3}$ to $315_{D6}$ in each of the memory blocks 210 might be applied while the read voltage is applied to selected word line $315_1$ in each of blocks 210, while the pass voltage is applied to unselected word lines $315_{D1}$, $315_{D2}$, $315_{D7}$, $315_{D8}$, and $315_2$ to $315_N$ in each of blocks 210, and while the activation voltage is applied to the select line 312 in each of blocks 210, for example. For some embodiments, the sets $230_1$ to $230_4$ of voltages SEL0 to SEL3 might be applied concurrently.

In each of blocks $210_1$ to $210_4$, the selector memory cells in the portion $240_1$ of the row of selector memory cells (e.g., the row selector memory cells $302_{D3}$ in FIGS. 3 and 4) coupled to selector word line $315_{D3}$ might be programmed and might have, for example, a logic level zero, whereas the memory cells in each of the remaining portions $240_2$ to $240_4$ of the row of selector memory cells coupled to selector word line $315_{D3}$ might be erased and might have a logic level one.

In each of blocks $210_1$ to $210_4$, the selector memory cells in the portion $240_2$ of the row of selector memory cells (e.g., the row selector memory cells $302_{D4}$ in FIGS. 3 and 4) coupled to selector word line $315_{D4}$ might be programmed and might have, for example, a logic level zero, whereas the memory cells in each of the remaining portions $240_1$, $240_3$, and $240_4$ of the row of selector memory cells coupled to selector word line $315_{D4}$ might be erased and might have a logic level one.

In each of blocks $210_1$ to $210_4$, the selector memory cells in the portion $240_3$ of the row of selector memory cells (e.g., the row selector memory cells $302_{D5}$ in FIGS. 3 and 4) coupled to selector word line $315_{D5}$ might be programmed and might have, for example, a logic level zero, whereas the memory cells in each of the remaining portions $240_1$, $240_2$, and $240_4$ of the row of selector memory cells coupled to selector word line $315_{D5}$ might be erased and might have a logic level one.

In each of blocks $210_1$ to $210_4$, the selector memory cells in the portion $240_4$ of the row of selector memory cells (e.g., the row selector memory cells $302_{D6}$ in FIGS. 3 and 4) coupled to selector word line $315_{D6}$ might be programmed and might have, for example, a logic level zero, whereas the memory cells in each of the remaining portions $240_1$ to $240_3$ of the row of selector memory cells coupled to selector word line $315_{D6}$ might be erased and might have a logic level one.

The set $230_1$ of voltages SEL0 to SEL3 may be applied to the selector word lines 315 of memory block $210_1$. The voltages SEL0=Vss, SEL1=Vss, SEL2=Vss, and SEL3=Vcc might be respectively applied to the selector word lines $315_{D3}$, $315_{D4}$, $315_{D5}$, and $315_{D6}$ of memory block $210_1$, for example. Voltages of Vss and Vcc can activate (e.g., turn on) all of the erased selector memory cells in memory block $210_1$. The voltage Vcc activates the programmed selector memory cells, e.g., selector memory cells $302_{D6}$ (FIGS. 3 and 4), in the portion $240_4$ of the row of selector memory cells commonly coupled to word line $315_{D6}$ in memory block $210_1$.

The voltage Vss is insufficient to activate the programmed selector memory cells, e.g., selector memory cells $302_{D3}$, $302_{D4}$, and $302_{D5}$ (FIGS. 3 and 4), in the portions $240_1$, $240_2$, and $240_3$ of the rows of selector memory cells respectively commonly coupled to selector word lines $315_{D3}$, $315_{D4}$, and $315_{D5}$ in memory block $210_1$ so that the programmed selector memory cells in the portions $240_1$, $240_2$, and $240_3$ of the rows of memory cells respectively commonly coupled to selector word lines $315_{D3}$, $315_{D4}$, and $315_{D5}$ in memory block $210_1$ are deactivated (e.g., non-conducting).

The programmed selector memory cells that are deactivated isolate the strings 306 of memory cells in memory block $210_1$ that include those deactivated selector memory cells from their respective data lines and thus prevent the data (e.g., user data and ECC) stored in those strings, e.g., stored in the data-storage memory cells (e.g., data-storage memory cells $302_1$ to $302_N$) of those stings 306, from being output to the page buffer. That is, the isolated strings are prevented from being sensed at the page buffer, e.g., by sense amplifiers coupled to the data lines selectively coupled to those strings, for example. Portions $240_1$, $240_2$, and $240_3$ of memory block $210_1$ are isolated, for example, preventing data from portions $240_1$, $240_2$, and $240_3$ of memory block $210_1$ from being respectively output to portions $250_1$, $250_2$, and $250_3$ of page buffer 220.

As used herein, isolating a memory cell or string of memory cells from a data line (e.g., a bit line) means to inhibit current flow through the memory cell or string of memory cells to that data line. For example, a memory cell or string of memory cells that is isolated from its bit line may be an inhibited memory cell or inhibited string of memory cells that is inhibited from being programmed or read (e.g., sensed). That is, programmed selector memory cells that are deactivated inhibit the strings of memory cells in memory block that include those deactivated selector memory cells, for example.

For example, the deactivated selector memory cells electrically isolate the strings in portions $240_1$ to $240_3$ of block $210_1$ that include the deactivated selector memory cells from the data lines, e.g., while the select transistors 304 in portions $240_1$ to $240_3$ of block $210_1$ coupled to the strings that include the deactivated selector memory cells and that are coupled to those data lines (e.g., the select transistors coupled between the strings and those data lines) are activated. The activated selector memory cells in portion $240_4$ of block $210_1$ allow the strings in portion $240_4$ of block $210_1$ that include the activated selector memory cells to be coupled to data lines through the activated select transistors 304 in portion $240_4$ of block $210_1$ that are coupled between the strings and those data lines.

The set $230_2$ of voltages SEL0 to SEL3 may be applied to the selector word lines 315 of memory block $210_2$. The voltages SEL0=Vss, SEL1=Vcc, SEL2=Vss, and SEL3=Vss might be respectively applied to the selector word lines $315_{D3}$, $315_{D4}$, $315_{D5}$, and $315_{D6}$ of memory block $210_2$, for example. Voltages of Vss and Vcc can activate all of the erased selector memory cells in memory block $210_2$. The voltage Vcc activates the programmed selector memory cells, e.g., selector memory cells $302_{D4}$ (FIGS. 3 and 4), in the portion $240_2$ of the row of selector memory cells commonly coupled to word line $315_{D4}$ in memory block $210_2$.

The voltage Vss is insufficient to activate the programmed selector memory cells, e.g., selector memory cells $302_{D3}$, $302_{D5}$, and $302_{D6}$ (FIGS. 3 and 4), in the portions $240_1$, $240_3$, and $240_4$ of the rows of selector memory cells respectively commonly coupled to selector word lines $315_{D3}$, $315_{D5}$, and $315_{D6}$ in memory block $210_2$ so that the programmed selector memory cells in the portions $240_1$, $240_3$, and $240_4$ of the rows of memory cells respectively commonly coupled to word lines $315_{D3}$, $315_{D5}$, and $315_{D6}$ in memory block $210_2$ are deactivated.

The programmed selector memory cells that are deactivated isolate the strings 306 of memory cells in memory block $210_2$ that include those deactivated selector memory cells and thus prevent the data (e.g., user data and ECC) stored in those strings, e.g., stored in the data-storage memory cells (e.g., data-storage memory cells $302_1$ to $302_N$) of those stings 306, from being output to the page buffer. That is, the deactivated strings are prevented from being sensed at the page buffer, e.g., by sense amplifiers coupled to the data lines selectively coupled to those strings, for example. Portions $240_1$, $240_3$, and $240_4$ of memory block $210_2$ are deactivated, for example, preventing data from portions $240_1$, $240_3$, and $240_4$ of memory block $210_2$ from being respectively output to portions $250_1$, $250_3$, and $250_4$ of page buffer 220.

For example, the deactivated selector memory cells electrically isolate the strings in portions $240_1$, $240_3$, and $240_4$ of block $210_2$ that include the deactivated selector memory cells from the data lines, e.g., while the select transistors 304 in portions $240_1$, $240_3$, and $240_4$ of block $210_2$ coupled to the strings that include the deactivated selector memory cells and that are coupled to those data lines (e.g., the select transistors coupled between the strings and those data lines) are activated. The activated selector memory cells in portion $240_2$ of block $210_2$ allow the strings in portion $240_2$ of block $210_2$ that include the activated selector memory cells to be coupled to data lines through the activated select transistors 304 in portion $240_2$ of block $210_2$ that are coupled between the strings and those data lines.

The set $230_3$ of voltages SEL0 to SEL3 may be applied to the selector word lines 315 of memory block $210_3$. The voltages SEL0=Vss, SEL1=Vss, SEL2=Vcc, and SEL3=Vss might be respectively applied to the selector word lines $315_{D3}$, $315_{D4}$, $315_{D5}$, and $315_{D6}$ of memory block $210_3$, for example. Voltages of Vss and Vcc can activate all of the erased selector memory cells in memory block $210_3$. The voltage Vcc activates the programmed selector memory cells, e.g., selector memory cells $302_{D5}$ (FIGS. 3 and 4), in the portion $240_3$ of the row of selector memory cells commonly coupled to word line $315_{D5}$ in memory block $210_3$.

The voltage Vss is insufficient to activate the programmed selector memory cells, e.g., selector memory cells $302_{D3}$, $302_{D4}$, and $302_{D6}$ (FIGS. 3 and 4), in the portions $240_1$, $240_2$, and $240_4$ of the rows of selector memory cells respectively commonly coupled to selector word lines $315_{D3}$, $315_{D4}$, and $315_{D6}$ in memory block $210_3$ so that the programmed selector memory cells in the portions $240_1$, $240_2$, and $240_4$ of the rows of memory cells respectively commonly coupled to word lines $315_{D3}$, $315_{D4}$, and $315_{D6}$ in memory block $210_3$ are deactivated.

The programmed selector memory cells that are deactivated isolate the strings 306 of memory cells in memory block $210_3$ that include those deactivated selector memory cells and thus prevent the data (e.g., user data and ECC) stored in those strings, e.g., stored in the data-storage memory cells (e.g., data-storage memory cells $302_1$ to $302_N$) of those stings 306, from being output to the page buffer. That is, the deactivated strings are prevented from being sensed at the page buffer, e.g., by sense amplifiers coupled to the data lines selectively coupled to those strings, for example. Portions $240_1$, $240_2$, and $240_4$ of memory block $210_3$ are deactivated, for example, preventing data from portions $240_1$, $240_2$, and $240_4$ of memory block $210_3$ from being respectively output to portions $250_1$, $250_2$, and $250_4$ of page buffer 220.

For example, the deactivated selector memory cells electrically isolate the strings in portions $240_1$, $240_2$, and $240_4$ of block $210_3$ that include the deactivated selector memory cells from the data lines, e.g., while the select transistors 304 in portions $240_1$, $240_2$, and $240_4$ of block $210_3$ coupled to the strings that include the deactivated selector memory cells and that are coupled to those data lines (e.g., the select transistors coupled between the strings and those data lines) are activated. The activated selector memory cells in portion $240_3$ of block $210_3$ allow the strings in portion $240_3$ of block $210_3$ that include the activated selector memory cells to be coupled to data lines through the activated select transistors 304 in portion $240_3$ of block $210_3$ that are coupled between the strings and those data lines.

The set $230_4$ of voltages SEL0 to SEL3 may be applied to the selector word lines 315 of memory block $210_4$. The voltages SEL0=Vcc, SEL1=Vss, SEL2=Vss, and SEL3=Vss might be respectively applied to the selector word lines $315_{D3}$, $315_{D4}$, $315_{D5}$, and $315_{D6}$ of memory block $210_4$, for example. Voltages of Vss and Vcc can activate all of the erased selector memory cells in memory block $210_4$. The voltage Vcc activates the programmed selector memory cells, e.g., selector memory cells $302_{D3}$ (FIGS. 3 and 4), in the portion $240_1$ of the row of selector memory cells commonly coupled to word line $315_{D3}$ in memory block $210_4$.

The voltage Vss is insufficient to activate the programmed selector memory cells, e.g., selector memory cells $302_{D4}$, $302_{D5}$, and $302_{D6}$ (FIGS. 3 and 4), in the portions $240_2$, $240_3$, and $240_4$ of the rows of selector memory cells respectively commonly coupled to selector word lines $315_{D4}$, $315_{D5}$, and $315_{D6}$ in memory block $210_4$ so that the programmed selector memory cells in the portions $240_2$, $240_3$, and $240_4$ of the rows of memory cells respectively commonly coupled to word lines $315_{D4}$, $315_{D5}$, and $315_{D6}$ in memory block $210_4$ are deactivated.

The programmed selector memory cells that are deactivated isolate the strings 306 of memory cells in memory block $210_4$ that include those deactivated selector memory cells and thus prevent the data (e.g., user data and ECC) stored in those strings, e.g., stored in the data-storage memory cells (e.g., data-storage memory cells $302_1$ to $302_N$) of those stings 306, from being output to the page buffer. That is, the deactivated strings are prevented from being sensed at the page buffer, e.g., by sense amplifiers coupled to the data lines selectively coupled to those strings, for example. Portions $240_2$, $240_3$, and $240_4$ of memory block $210_4$ are deactivated, for example, preventing data from portions $240_2$, $240_3$, and $240_4$ of memory block $210_4$ from being respectively output to portions $250_2$, $250_3$, and $250_4$ of page buffer 220.

For example, the deactivated selector memory cells electrically isolate the strings in portions $240_2$ to $240_4$ of block $210_4$ that include the deactivated selector memory cells from the data lines, e.g., while the select transistors 304 in portions $240_2$ to $240_4$ of block $210_4$ coupled to the strings that include the deactivated selector memory cells and that are coupled to those data lines (e.g., the select transistors coupled between the strings and those data lines) are activated. The activated selector memory cells in portion $240_1$ of block $210_4$ allow the strings in portion $240_1$ of block $210_4$ that include the activated selector memory cells to be coupled to data lines through the activated select transistors 304 in portion $240_1$ of block $210_4$ that are coupled between the strings and those data lines.

Note that select transistors 304 in portion $240_4$ of block $210_1$ are coupled between the strings 306 in portion $240_4$ of block $210_1$ and data lines, such as first bit lines 310, that pass through portion $240_4$ of each of blocks $210_1$ to $210_4$, that the select transistors 304 in portion $240_4$ of block $210_2$ are coupled between the strings 306 in portion $240_4$ of block $210_2$ and the first bit lines 310, that the select transistors 304 in portion $240_4$ of block $210_3$ are coupled between the strings 306 in portion $240_4$ of block $210_3$ and the first bit lines 310, and that the select transistors 304 in portion $240_4$ of block $210_4$ are coupled between the strings 306 in portion $240_4$ of block $210_4$ and the first bit lines 310.

Note, also, that the select transistors 304 in portion $240_3$ of block $210_1$ are coupled between the strings 306 in portion $240_3$ of block $210_1$ and data lines, such as second bit lines 310, that pass through portion $240_3$ of each of blocks $210_1$ to $210_4$, that the select transistors 304 in portion $240_3$ of block $210_2$ are coupled between the strings 306 in portion $240_3$ of block $210_2$ and the second bit lines 310, that the select transistors 304 in portion $240_3$ of block $210_3$ are coupled between the strings 306 in portion $240_3$ of block $210_3$ and the second bit lines 310, and that the select transistors 304 in portion $240_3$ of block $210_4$ are coupled between the strings 306 in portion $240_3$ of block $210_4$ and the second bit lines 310.

Note that the select transistors 304 in portion $240_2$ of block $210_1$ are coupled between the strings 306 in portion $240_2$ of block $210_1$ and data lines, such as third bit lines 310, that pass through portion $240_2$ of each of blocks $210_1$ to $210_4$, that the select transistors 304 in portion $240_2$ of block $210_2$ are coupled between the strings 306 in portion $240_2$ of block $210_2$ and the third bit lines 310, that the select transistors 304 in portion $240_2$ of block $210_3$ are coupled between the strings 306 in portion $240_2$ of block $210_3$ and the third bit lines 310, and that the select transistors 304 in portion $240_2$ of block $210_4$ are coupled between the strings 306 in portion $240_2$ of block $210_4$ and the third bit lines 310.

Note that the select transistors 304 in portion $240_1$ of block $210_1$ are coupled between the strings 306 in portion $240_1$ of block $210_1$ and data lines, such as fourth bit lines 310, that pass through portion $240_1$ of each of blocks $210_1$ to $210_4$, that the select transistors 304 in portion $240_1$ of block $210_2$ are coupled between the strings 306 in portion $240_1$ of block $210_2$ and the fourth bit lines 310, that the select transistors 304 in portion $240_1$ of block $210_3$ are coupled between the strings 306 in portion $240_1$ of block $210_3$ and the fourth bit lines 310, and that the select transistors 304 in portion $240_1$ of block $210_4$ are coupled between the strings 306 in portion $240_1$ of block $210_4$ and the fourth bit lines 310.

In the example of FIG. 5A, the only portions 240 of the rows of selector memory cells that are activated are the portion $240_4$ of the row of selector memory cells commonly coupled to word line $315_{D6}$ in memory block $210_1$, the portion $240_2$ of the row of selector memory cells commonly coupled to word line $315_{D4}$ in memory block $210_2$, the portion $240_3$ of the row of selector memory cells commonly coupled to word line $315_{D5}$ in memory block $210_3$, and the portion $240_1$ of the row of selector memory cells commonly coupled to word line $315_{D3}$ in memory block $210_4$. As such, the only data that is output from memory blocks $210_1$, $210_2$, $210_3$, and $210_4$ is respectively from portion $240_4$ of block $210_1$, portion $240_2$ of block $210_2$, portion $240_3$ of block $210_3$, and portion $240_1$ of block $210_4$. For example, this might allow data (e.g., user data and ECC) to be read concurrently from the different memory blocks $210_1$, $210_2$, $210_3$, and $210_4$, e.g., where the portions $240_1$ to $240_4$ have the same address, such as the same page address. That is, target memory cells respectively in the portions $240_1$ to $240_4$ might be addressed by the same (e.g., a common) page address, for example.

The data from the different memory blocks $210_1$, $210_2$, $210_3$, and $210_4$ might be respectively output concurrently to the portions $250_4$, $250_2$, $250_3$, and $250_1$, for example. That is, the data from the different memory blocks $210_1$, $210_2$, $210_3$, and $210_4$ may be respectively sensed concurrently at the portions $250_4$, $250_2$, $250_3$, and $250_1$, e.g., in response to a sense amplifier enable signal commonly received at portions $250_4$, $250_2$, $250_3$, and $250_1$.

The data from the different memory blocks $210_1$, $210_2$, $210_3$, and $210_4$ that is respectively sensed concurrently at the portions $250_4$, $250_2$, $250_3$, and $250_1$ might be in response to applying a read voltage concurrently to the selected word line $302_1$ in each of the different memory blocks $210_1$, $210_2$, $210_3$, and $210_4$, for example, while the pass voltages are applied concurrently to the unselected word lines $315_{D1}$, $315_{D2}$, $315_{D7}$, $315_{D8}$, and $315_2$ to $315_N$ in each of the different memory blocks $210_1$, $210_2$, $210_3$, and $210_4$, while an activation voltage is applied concurrently to the select line 312 in each of the different memory blocks $210_1$, $210_2$, $210_3$, and $210_4$, and while the sets $230_1$ to $230_4$ of voltages SEL0 to SEL3 are applied concurrently to the selector word lines $315_{D3}$, $315_{D4}$, $315_{D5}$, and $315_{D6}$ in the different memory blocks $210_1$, $210_2$, $210_3$, and $210_4$. For example, the read voltage, pass voltages, the activation voltage, and the sets $230_1$ to $230_4$ of voltages SEL0 to SEL3 might be applied concurrently to the different memory blocks $210_1$, $210_2$, $210_3$, and $210_4$.

For the data to be output from portion $240_4$ of block $210_1$, portion $240_2$ of block $210_2$, portion $240_3$ of block $210_3$, and portion $240_1$ of block $210_4$ concurrently, the activation voltage may be applied to the select line 312 in each of the different memory blocks $210_1$, $210_2$, $210_3$, and $210_4$ concurrently, and the bit lines 310 coupled to the strings 306 in portions $240_1$ to $240_4$ may be selected concurrently, e.g., bit lines $310_1$ to $310_M$ may be selected concurrently. Note that different subsets of the bit lines $310_1$ to $310_M$ might be respectively selectively coupled to the strings 306 in portions $240_1$ to $240_4$. For example, the subset of the bit lines $310_1$ to $310_M$ coupled to sense amplifiers in portion $250_1$ of page buffer 220 (e.g., the fourth bit lines 310 that pass through portions $240_1$), the subset of the bit lines $310_1$ to $310_M$ coupled to sense amplifiers in portion $250_2$ of page buffer 220 (e.g., the third bit lines 310 that pass through portions $240_2$), the subset of the bit lines $310_1$ to $310_M$ coupled to sense amplifiers in portion $250_3$ of page buffer 220 (e.g., the second bit lines 310 that pass through portions $240_3$), and the subset of the bit lines $310_1$ to $310_M$ coupled to sense amplifiers in portion $250_4$ of page buffer 220 (e.g., the first bit lines 310 that pass through portions $240_4$) may be respectively coupled to the strings 306 in portions $240_1$, $240_2$, $240_3$, and $240_4$.

Note that the portion $240_1$ of each of blocks $210_1$ to $210_3$ is not selected, but that a read voltage might be applied to the selected word line $315_1$ in each of blocks $210_1$ to $210_3$, that the select transistors 304 in each of blocks $210_1$ to $210_3$ are activated, and that the bit lines coupled to the select transistors 304 that are coupled to strings 306 in the portion $240_1$ of each of blocks $210_1$ to $210_3$ are selected. Also note that unselected memory cells $302_1$ are commonly coupled the selected word line $315_1$ in each of blocks $210_1$ to $210_3$. The deactivated selector memory cells in the portion $240_1$ of each of blocks $210_1$ to $210_3$ isolate the unselected memory cells $302_1$ that are commonly coupled the selected word line $315_1$ in each of blocks $210_1$ to $210_3$ from the selected bit lines that are coupled to the select transistors 304 that are coupled to strings 306 that include the unselected memory cells $302_1$ and the deactivated selector memory cells. A selector memory cell is used to isolate an unselected memory cell coupled to a selected word line from a selected bit line, in that the select transistor coupled between the selected bit line and the string 306 that includes the selector memory cell and the unselected memory cell is activated.

The row of dummy memory cells $302_{D1}$ commonly coupled to dummy word line $315_{D1}$ and the row of dummy memory cells $302_{D2}$ commonly coupled to dummy word line $315_{D2}$ in FIG. 3 might be respectively used as selector memory cells instead of the row of dummy memory cells $302_{D3}$ commonly coupled to dummy word line $315_{D3}$ and the row of dummy memory cells $302_{D4}$ commonly coupled to dummy word line $315_{D4}$, for some embodiments. For example, the voltages SEL0 and SEL1 might be respectively applied to dummy word lines $315_{D1}$ and $315_{D2}$, where the row of dummy memory cells $302_{D1}$ in each of the blocks $210_1$ to $210_4$ might be programmed as shown in FIG. 5A for the row of memory cells memory cells $302_{D3}$ coupled to word line $315_{D3}$ in each of the blocks $210_1$ to $210_4$ and the row of dummy memory cells $302_{D2}$ in each of the blocks $210_1$ to $210_4$ might be programmed as shown in FIG. 5A for the row of memory cells $302_{D4}$ coupled to word line $315_{D4}$ in each of the blocks $210_1$ to $210_4$.

For some embodiments, the row of dummy memory cells $302_{D7}$ commonly coupled to dummy word line $315_{D7}$ and the row of dummy memory cells $302_{D8}$ commonly coupled to dummy word line $315_{D8}$ in FIG. 3 might be respectively used as selector memory cells instead of the row of dummy memory cells $302_{D5}$ commonly coupled to dummy word line $315_{D5}$ and the row of dummy memory cells $302_{D6}$ commonly coupled to dummy word line $315_{D6}$. For example, the voltages SEL2 and SEL3 might be respectively applied to dummy word lines $315_{D7}$ and $315_{D8}$, where the row of dummy memory cells $302_{D7}$ in each of the blocks $210_1$ to $210_4$ might be programmed as shown in FIG. 5A for the row of memory cells memory cells $302_{D5}$ coupled to word line $315_{D5}$ in each of the blocks $210_1$ to $210_4$ and the row of dummy memory cells $302_{D8}$ in each of the blocks $210_1$ to $210_4$ might be programmed as shown in FIG. 5A for the row of memory cells memory cells $302_{D6}$ coupled to word line $315_{D6}$ in each of the blocks $210_1$ to $210_4$.

For some embodiments, the row of dummy memory cells $302_{D7}$ commonly coupled to dummy word line $315_{D7}$ and the row of dummy memory cells $302_{D8}$ commonly coupled to dummy word line $315_{D8}$ in FIG. 4 might be respectively used as selector memory cells instead of the row of dummy memory cells $302_{D3}$ commonly coupled to dummy word line $315_{D3}$ and the row of dummy memory cells $302_{D4}$ commonly coupled to dummy word line $315_{D4}$, and the row of dummy memory cells $302_{D5}$ commonly coupled to dummy word line $315_{D5}$ and the row of dummy memory cells $302_{D6}$ commonly coupled to dummy word line $315_{D6}$ in FIG. 4 might be respectively used as selector memory cells instead of the row of dummy memory cells $302_{D3}$ commonly coupled to dummy word line $315_{D3}$ and the row of dummy memory cells $302_{D4}$ commonly coupled to dummy word line $315_{D4}$. For example, the voltages SEL0 to SEL3 might be respectively applied to dummy word lines $315_{D5}$ to $315_{D8}$ in FIG. 4, where the row of dummy memory cells $302_{D5}$ in each of the blocks $210_1$ to $210_4$ might be programmed as shown in FIG. 5A for the row of "dummy memory cells $302_{D3}$ coupled to word line $315_{D3}$ in each of the blocks $210_1$ to $210_4$, where the row of dummy memory cells $302_{D6}$ in each of the blocks $210_1$ to $210_4$ might be programmed as shown in FIG. 5A for the row of dummy memory cells $302_{D4}$ coupled to word line $315_{D4}$ in each of the blocks $210_1$ to $210_4$, where the row of dummy memory cells $302_{D7}$ in each of the blocks $210_1$ to $210_4$ might be programmed as shown in FIG. 5A for the row of dummy memory cells memory cells $302_{D5}$ coupled to word line $315_{D5}$ in each of the blocks $210_1$ to $210_4$, and where the row of dummy memory cells $302_{D8}$ in each of the blocks $210_1$ to $210_4$ might be programmed as shown in FIG. 5A for the row of dummy memory cells memory cells $302_{D6}$ coupled to word line $315_{D6}$ in each of the blocks $210_1$ to $210_4$, and where the row of dummy memory cells $302_{D4}$ commonly coupled to word line $315_{D4}$, the row of dummy memory cells $302_{D3}$ commonly coupled to word line $315_{D3}$, the row of dummy memory cells $302_{D2}$ commonly coupled to word line $315_{D2}$, and the row of dummy memory cells $302_{D1}$ commonly coupled to word line $315_{D1}$ in FIG. 4 in each of the blocks $210_1$ to $210_4$ are not used as selector memory cells.

Each of the different memory blocks $210_1$, $210_2$, $210_3$, and $210_4$ might have a different physical block address, but each of the portions $240_4$ of block $210_1$, $240_2$ of block $210_2$, $240_3$ of block $210_3$, and $240_1$ of block $210_4$ might have the same page (e.g., logical row) address. For example, when each of the portions $240_4$ of block $210_1$, $240_2$ of block $210_2$, $240_3$ of block $210_3$, and $240_1$ of block $210_4$ have the same page address, the data from the respective portions $240_1$, $240_2$, $240_3$, and $240_4$, might be respectively concurrently sensed from portions $250_1$, $250_2$, $250_3$, and $250_4$ of page buffer 220, e.g., in response to a sense amplifier enable signal being received concurrently at portions $250_1$, $250_2$, $250_3$, and $250_4$ of page buffer 220.

Alternatively, each of the different memory blocks $210_1$, $210_2$, $210_3$, and $210_4$ might have a different physical block address, and each of the portions $240_4$ of block $210_1$, $240_2$ of block $210_2$, $240_3$ of block $210_3$, and $240_1$ of block $210_4$ might have a different page address. For example, when each of the portions $240_4$ of block $210_1$, $240_2$ of block $210_2$, $240_3$ of block $210_3$, and $240_1$ of block $210_4$ has a different page address, the data from the respective portions $240_1$, $240_2$, $240_3$, and $240_4$ might be sensed from portions $250_1$, $250_2$, $250_3$, and $250_4$ of page buffer 220 individually one at a time, e.g., in response to a sense amplifier enable signal being received at respective ones of the portions $250_1$, $250_2$, $250_3$, and $250_4$. For example, target memory cells in the portions $240_1$, $240_2$, $240_3$, and $240_4$ might be respectively addressed by different page addresses. Data might be sensed sequentially from portions $250_1$, $250_2$, $250_3$, and $250_4$ in response to sense amplifier enable signals being received sequentially at portions $250_1$, $250_2$, $250_3$, and $250_4$, for example.

For example, block $210_4$ and the page corresponding to portion $240_1$ of block $210_4$ might be selected, while the remaining blocks $210_1$ to $210_3$ remain unselected. Subsequently, portion $250_1$ may be sensed in response to a sense amplifier enable signal received concurrently at the sense amplifiers in portion $250_1$ that are coupled to the pre-charged data lines.

After sensing portion $250_1$ of block $210_4$, block $210_2$ and the page corresponding to portion $240_2$ of block $210_2$ might be selected, while the remaining blocks $210_1$, $210_3$, and $210_4$ remain unselected. Then, all of the data lines coupled to the memory cells in portion $240_2$ and coupled to sense amplifiers in the portion $250_2$, corresponding to portion $240_2$, might be pre-charged, while the data lines coupled to the memory cells in remaining portions $240_1$, $240_3$, and $240_4$ might remain uncharged. Subsequently, portion $250_2$ may be sensed in response to a sense amplifier enable signal received concurrently at the sense amplifiers in portion $250_2$ that are coupled to the pre-charged data lines.

After sensing portion $250_2$ of block $210_2$, block $210_3$ and the page corresponding to portion $240_3$ of block $210_3$ might be selected, while the remaining blocks $210_1$, $210_2$, and $210_4$ remain unselected. Then, all of the data lines coupled to the memory cells in portion $240_3$ and coupled to sense amplifiers in the portion $250_3$, corresponding to portion $240_3$, might be pre-charged, while the data lines coupled to the memory cells in remaining portions $240_1$, $240_2$, and $240_4$ might remain uncharged. Subsequently, portion $250_3$ may be sensed in response to a sense amplifier enable signal received concurrently at the sense amplifiers in portion $250_3$ that are coupled to the pre-charged data lines.

After sensing portion $250_3$ of block $210_3$, block $210_1$ and the page corresponding to portion $240_4$ of block $210_1$ might be selected, while the remaining blocks $210_2$ to $210_4$ remain unselected. Then, all of the data lines coupled to the memory cells in portion $240_4$ and coupled to sense amplifiers in the portion $250_4$, corresponding to portion $240_4$, might be pre-charged, while the data lines coupled to the memory cells in remaining portions $240_2$ to $240_4$ might remain uncharged. Subsequently, portion $250_4$ may be sensed in response to a sense amplifier enable signal received concurrently at the sense amplifiers in portion $250_4$ that are coupled to the pre-charged data lines.

Figure 5B:
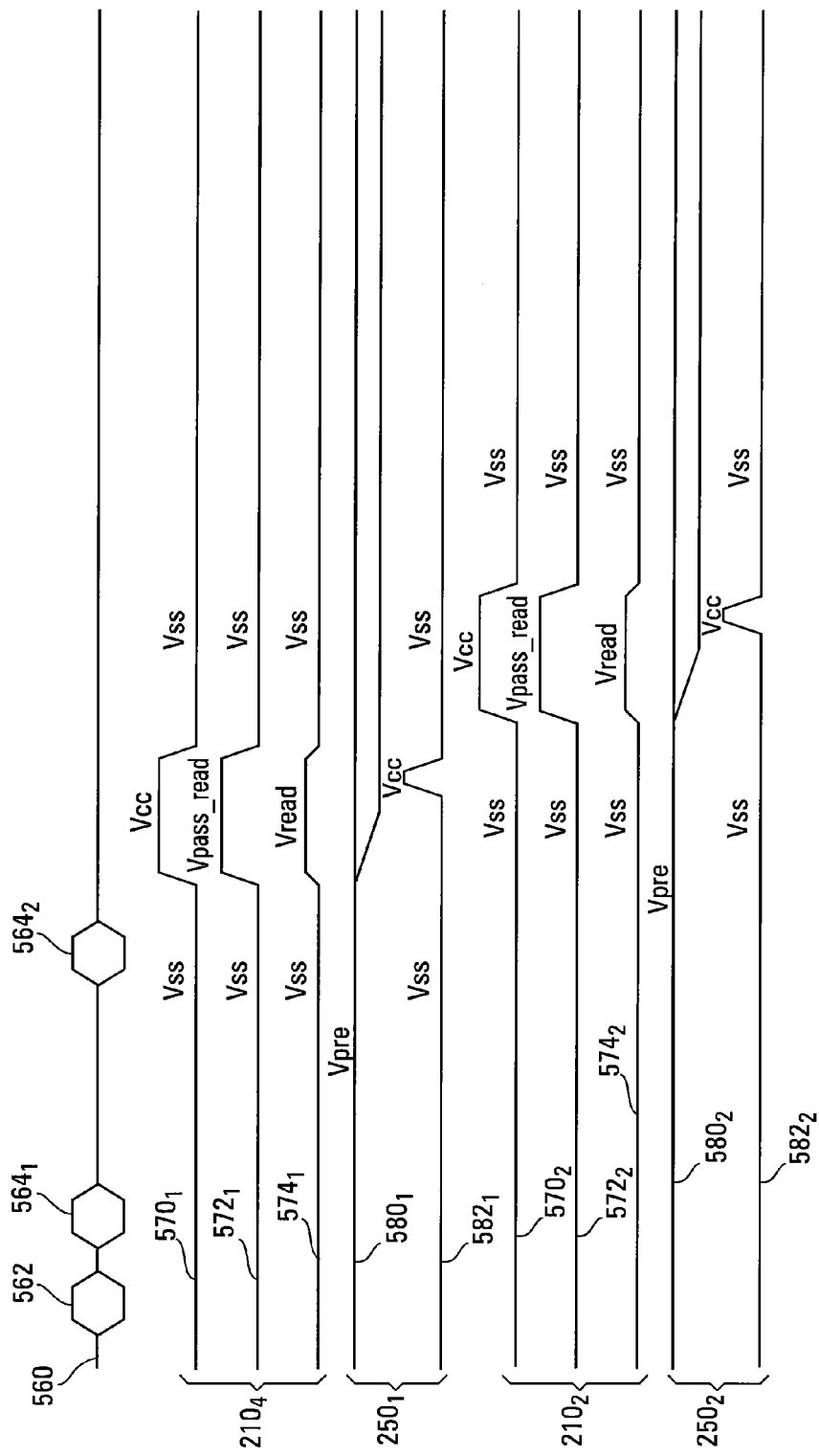
FIG. 5B illustrates a timing diagram for a sense operation, according to another embodiment.

FIG. 5B presents a timing diagram for an example where portion $240_1$ of block $210_4$ and portion $240_2$ of block $210_2$ have different page addresses and are sensed individually one at a time. For example, a sense (e.g., read) operation might commence by memory device 100 (FIG. 1) receiving, e.g., from controller 130, an input signal 560 that might include a read command 562 followed in sequence by addresses $564_1$ to $564_2$, where each address 564 comprises a block and a page address. That is, the page address for block $210_4$ might address portion $240_1$ of block $210_4$, and the page address for block $210_2$ might address portion $240_2$ of block $210_2$, for example.

During the read operation, the select line 312 (e.g., the drain select line) and the select line 313 (e.g., the source select line) (FIGS. 3 and 4) in blocks $210_4$ and $210_2$ might respectively receive voltages $570_1$ and $570_2$. While read command 562 and addresses 564 are being received, voltages $570_1$ and $570_2$ might be at a voltage level, such as Vss, that is insufficient to activate the select transistors 304 (e.g., the drain select transistors) coupled to select lines 312 and the select transistors 303 (e.g., the source select transistors) coupled to select lines 313.

The unselected word lines (e.g., unselected word lines $315_{D1}$, $315_{D2}$, $315_{D7}$, $315_{D8}$, and $315_2$ to $315_N$) in blocks $210_4$ and $210_2$ might respectively receive voltages $572_1$ and $572_2$. While read command 562 and addresses 564 are being received, voltages $572_1$ and $572_2$ might be at a voltage level, such as Vss. Selected word lines (e.g., selected word line $315_1$) in blocks $210_4$ and $210_2$ might respectively receive voltages $574_1$ and $574_2$ that might be at a voltage level, such as Vss, while read command 562 and addresses 564 are being received.

The bit lines coupled to portion $250_1$ of page buffer 220 might receive a voltage $580_1$, and the bit lines coupled to portion $250_2$ of page buffer 220 might receive a voltage $580_2$. While read command 562 and addresses 564 are being received, voltages $580_1$ and $580_2$ might be at a pre-charge voltage level, such as a pre-charge voltage level Vpre, so that the bit lines coupled to portions $250_1$ and $250_2$ are pre-charged to the pre-charge voltage level Vpre.

Portions $250_1$ and $250_2$ of page buffer 220 might respectively receive sense enable signals $582_1$ and $582_2$. While read command 562 and addresses 564 are being received, sense enable signals $582_1$ and $582_2$ might be at a voltage level, such as Vss, that is insufficient to enable portions $250_1$ and $250_2$ of page buffer 220 for sensing the bit lines.

After the address 564, including the address of final page (e.g., address $564_2$) to be sensed, is received, portion $240_1$ of block $210_4$ is sensed. That is, the voltages $570_1$, $572_1$, and $574_1$ are respectively concurrently increased from the voltage level Vss to a voltage level, such as Vcc, that activates the select transistors (e.g., the source select transistors and the drain select transistors) in block $210_4$, from the voltage level Vss to a pass voltage level, such as Vpass_read, that activates the memory cells coupled to the unselected word lines, and from the voltage level Vss to a read voltage level, such as Vread. If the read voltage level is insufficient to activate the memory cells coupled to the selected word line, the voltage $580_1$ of the bit lines coupled to portion $250_1$ of page buffer 220 may remain at the pre-charge voltage level Vpre, whereas if the read voltage level is sufficient activate the memory cells coupled to the selected word line, the voltage $580_1$ may discharge from the pre-charge voltage level Vpre. Subsequently, the sense enable signal $582_1$ may be increased from the voltage level Vss to a voltage level, such as Vcc, sufficient to enable sensing of the bit lines coupled to portion $250_1$ of page buffer 220.

Note that during the sensing of portion $240_1$ of block $210_4$, the voltages SEL0=Vcc, SEL1=Vss, SEL2=Vss, and SEL3=Vss might be respectively applied to the selector word lines $315_{D3}$, $315_{D4}$, $315_{D5}$, and $315_{D6}$ of memory block $210_4$, as shown in FIG. 5A. Also during the sensing of portion $240_1$ of block $210_4$, the voltage $570_2$ is at the voltage level Vss so that the source select transistors and the drain select transistors in block $210_2$ are deactivated, preventing any current on the bit lines coupled to portion $250_1$ of page buffer 220 from the strings in block $210_2$. Also during the sensing of portion $240_1$ of block $210_4$, the voltage of select enable signal $582_2$ is at the voltage level Vss so that the portion $250_2$ of page buffer 220 is not enabled for sensing. After the portion $240_1$ of block $210_4$ is sensed, the voltages $570_1$, $572_1$, $574_1$ and the voltage of sense enable signal $582_1$ are returned to the voltage level Vss, so that the source select transistors and the drain select transistors in block $210_4$ are deactivated and so the portion $250_1$ of page buffer 220 is no longer enabled for sensing.

After portion $240_1$ of block $210_4$ is sensed and the voltages $570_1$, $572_1$, $574_1$ and the voltage of sense enable signal $582_1$ are returned to the voltage level Vss, portion $240_2$ of block $210_2$ is sensed. That is, the voltages $570_2$, $572_2$, and $574_2$ are respectively concurrently increased from the voltage level Vss to a voltage level, such as Vcc, that activates the select transistors (e.g., the source select transistors and the drain select transistors) in block $210_2$, from the voltage level Vss to a pass voltage level, such as Vpass_read, that activates the memory cells coupled to the unselected word lines, and from the voltage level Vss to a read voltage level, such as Vread. If the read voltage level is insufficient activate the memory cells coupled to the selected word line, the voltage $580_2$ of the bit lines coupled to portion $250_2$ of page buffer 220 may remain at the pre-charge voltage level Vpre, whereas if the read voltage level is sufficient activate the memory cells coupled to the selected word line, the voltage $580_2$ may discharge from the pre-charge voltage level Vpre. Subsequently, the sense enable signal $582_2$ may be increased from the voltage level Vss to a voltage level, such as Vcc, sufficient to enable sensing of the bit lines coupled to portion $250_2$ of page buffer 220.

Note that during the sensing of portion $240_2$ of block $210_2$, the voltages SEL0=Vss, SEL1=Vcc, SEL2=Vss, and SEL3=Vss might be respectively applied to the selector word lines $315_{D3}$, $315_{D4}$, $315_{D5}$, and $315_{D6}$ of memory block $210_2$, as shown in FIG. 5A. Also during the sensing of portion $240_2$ of block $210_2$, the voltage $570_1$ is at the voltage level Vss so that the source select transistors and the drain select transistors in block $210_4$ are deactivated, preventing any current on the bit lines coupled to portion $250_2$ of page buffer 220 from the strings in block $210_4$; Also during the sensing of portion $240_2$ of block $210_2$, the voltage of select enable signal $582_1$ is at the voltage level Vss so that the portion $250_1$ of page buffer 220 is not enabled for sensing. After the portion $240_2$ of block $210_2$ is sensed, the voltages $570_2$, $572_2$, $574_2$ and the voltage of sense enable signal $582_2$ are returned to the voltage level Vss, so that the source select transistors and the drain select transistors in block $210_2$ are deactivated and so the portion $250_2$ of page buffer 220 is no longer enabled for sensing.

The selector memory cells might be used to select multiple portions of a single memory block for reading. For example, portions $240_1$ and $240_2$ of memory block $210_1$ might be selected for reading, while the remaining portions $240_3$ and $240_4$ of memory block $210_1$ and the portions $240_2$ to $240_4$ of the remaining memory blocks $210_2$ to $210_4$ are unselected. Portions $240_1$ and $240_2$ of memory block $210_1$ might be selected by respectively applying the voltages SEL0=Vcc, SEL1=Vcc, SEL2=Vss, and SEL3=Vss to the selector word lines $315_{D3}$, $315_{D4}$, $315_{D5}$, and $315_{D6}$ of memory block $210_1$, as programmed in FIG. 6, for example. That is, SEL0=Vcc, SEL1=Vcc, SEL2=Vss, and SEL3=Vss might respectively replace SEL0=Vss, SEL1=Vss, SEL2=Vss, and SEL3=Vcc in the set $230_1$ of voltages SEL0 to SEL3 for memory block $210_1$ in FIG. 5A, while the remaining memory blocks $240_2$ to $240_4$ are unselected. The voltages SEL0=Vcc, SEL1=Vcc, SEL2=Vss, and SEL3=Vss might be applied to the selector word lines $315_{D3}$, $315_{D4}$, $315_{D5}$, and $315_{D6}$ of memory block $210_1$, as programmed in FIG. 6, while the read voltage is applied to selected word line $315_1$ in block $210_1$ and while the pass voltage is applied to unselected word lines $315_{D1}$, $315_{D2}$, $315_{D7}$, $315_{D8}$, and $315_2$ to $315_N$ in block $210_1$, for example.

Figure 6:
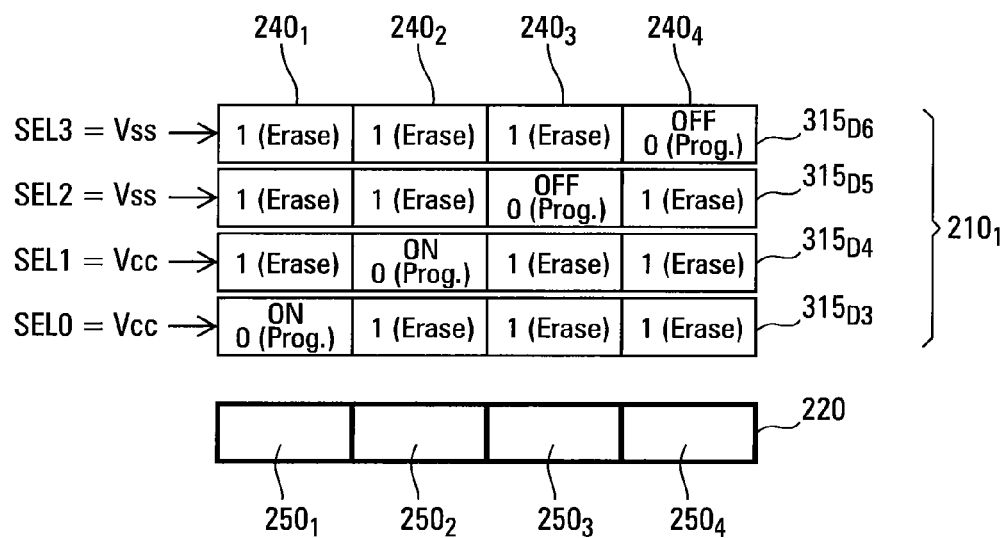
FIG. 6 is a block diagram illustrating the states of selector memory cells a block of a memory array, according to another embodiment.

In the example of FIG. 6, the voltages of Vss and Vcc can activate all of the erased selector memory cells in memory block $210_1$. The voltage SEL0=Vcc activates the programmed selector memory cells in the portion $240_1$ of the row of selector memory cells commonly coupled to word line $315_{D3}$ in memory block $210_1$. The voltage SEL1=Vcc activates the programmed selector memory cells in the portion $240_2$ of the row of selector memory cells commonly coupled to word line $315_{D4}$ in memory block $210_1$. The voltage SEL2=Vss is insufficient to activate the programmed selector memory cells in portion $240_3$ commonly coupled to selector word line $315_{D5}$, and the voltage SEL3=Vss is insufficient to activate the programmed selector memory cells in portion $240_4$ commonly coupled to selector word line $315_{D6}$. Therefore, the programmed selector memory cells in the portions $240_3$ and $240_4$ of the rows of memory cells respectively commonly coupled to word lines $315_{D5}$ and $315_1)_6$ in memory block $210_1$ are deactivated. The programmed selector memory cells that are deactivated isolate the strings of memory cells in the portions $240_3$ and $240_4$ memory block $210_1$ that include those deactivated selector memory cells and thus prevent the data (e.g., user data and ECC) stored in portions $240_3$ and $240_4$ from respectively being output to (e.g., sensed at) portions $250_3$ and $250_4$ of page buffer 220. That is, the deactivated selector memory cells isolate the strings of memory cells that include those deactivated selector memory cells from the bit lines that are coupled to the select transistors that are coupled to the strings with the deactivated selector memory cells, while the select transistors are activated, for example.

In the example of FIG. 6, the only portions 240 of the rows of selector memory cells that are activated are the portions $240_1$ and $240_2$ of the rows of selector memory cells respectively commonly coupled to word lines $315_{D3}$ and $315_{D4}$. As such, the only data that is sensed is from the strings of memory cells in portions $240_1$ and $240_2$ that include the selector memory cells that are activated. For example, the data from portions $240_1$ and $240_2$ may be respectively sensed at portions $250_1$ and $250_2$ of page buffer 220, e.g., concurrently.

Figure 7:
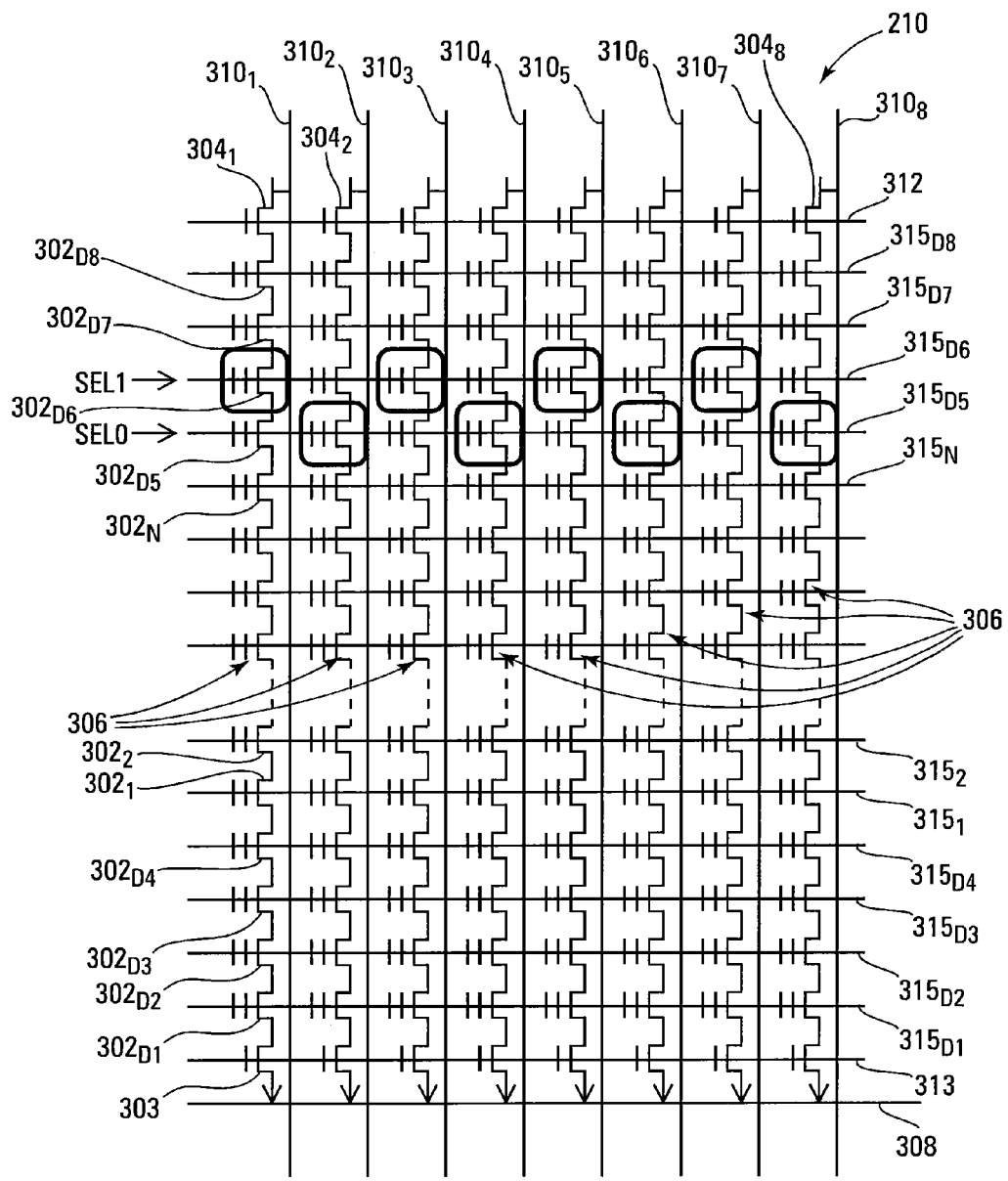
FIG. 7 is a schematic diagram of a memory block during the sensing of certain data lines, according to another embodiment.

FIG. 7 is a schematic diagram of a memory block 210 during the sensing of certain selected bit lines in memory block 210. Memory block 210 might be a single selected memory block selected from a plurality of memory blocks, such as memory blocks $210_1$ to $210_4$ in FIG. 2. Common numbering is used in FIGS. 3 and 7 to denote similar (e.g., the same) components, e.g., where the commonly numbered components may be as described above in conjunction with FIG. 3.

The selector memory cells $302_{D5}$ and $302_{D6}$ respectively commonly coupled to selector word lines $315_{D5}$ and $315_{D6}$ that are enclosed in boxes might be programed and might have, for example, a logic level zero, whereas the remaining selector memory cells $302_{D5}$ and $302_{D6}$ respectively commonly coupled to selector word lines $315_{D5}$ and $315_{D6}$ might be erased and might have, for example, a logic level one. The programed and erased states of the selector memory cells $302_{D5}$ and $302_{D6}$ that are respectively coupled to selector word lines $315_{D5}$ and $315_{D6}$ in conjunction with the voltages SEL0 and SEL1 respectively applied to selector word lines $315_{D5}$ and $315_{D6}$ facilitates the selection of strings 306 corresponding to certain bit lines (e.g., odd or even bit lines) 310 for sensing (e.g., reading). For example, this might be referred to as distributed sensing. The odd or even selected bit lines 310 might be sensed concurrently, for example.

The voltages SEL0 and SEL1 might be respectively applied to selector word lines $315_{D5}$ and $315_{D6}$ while a read voltage is applied to selected word line $315_1$ in block 210 in FIG. 7, while the pass voltage is applied to unselected word lines $315_{D1}$ to $315_{D4}$, $315_{D7}$, $315_{D8}$, and $315_2$ to $315_N$ in block 210 in FIG. 7, and while an activation voltage is applied to select line 312 that activates the row (e.g., all) of the select transistors 304 commonly coupled to select line 312, for example.

The odd bit lines (e.g. bit lines $310_1$, $310_3$, $310_5$, and $310_7$), and thus the strings 306 corresponding to the odd bit lines, might be selected, without selecting the even bit lines (e.g. bit lines $310_2$, $310_4$, $310_6$, and $310_8$), and thus the strings 306 corresponding to the even bit lines, by activating the row of selector memory cells $302_{D6}$ commonly coupled to selector word line $315_{D6}$ while the selector memory cells $302_{D5}$ commonly coupled to selector word line $315_{D5}$ that are in strings 306 corresponding to even bit lines are deactivated and the selector memory cells $302_{D5}$ commonly coupled to selector word line $315_{D5}$ that are in strings 306 corresponding to odd bit lines are activated.

For example, to select the odd bit lines, and thus the strings 306 corresponding to the odd bit lines, without selecting the even bit lines, and thus the strings 306 corresponding to the even bit lines, the voltage SEL0 might be a voltage, such as Vss, that is below the threshold voltages of the programmed (e.g., the boxed) memory cells $302_{D5}$ and above the threshold voltages of the erased (e.g., the unboxed) memory cells $302_{D5}$, whereas the voltage SEL1 might be a voltage, such as Vcc, that is above the threshold voltages of the programmed memory cells $302_{D6}$ and above the threshold voltages of the erased memory cells $302_{D6}$.

The voltage SEL1=Vcc activates the entire row of selector memory cells $302_{D6}$ (e.g., the programmed and erased memory cells $302_{D6}$) commonly coupled to selector word line $315_{D6}$. The voltage SEL0=Vss activates the erased selector memory cells $302_{D5}$ commonly coupled to selector word line $315_{D5}$, but is insufficient to activate the selector memory cells $302_{D5}$ commonly coupled to selector word line $315_{D5}$ that are programmed (e.g., the boxed selector memory cells $302_{D5}$). For example, the programmed selector memory cells $302_{D5}$ are deactivated, whereas the programmed selector memory cells $302_{D6}$ are activated. Therefore, the strings 306, corresponding to even bit lines 310 that contain programmed selector memory cells $302_{D5}$ that are deactivated are isolated from their corresponding even bit lines 310, and thus unselected. That is, the programmed selector memory cells $302_{D5}$ that are deactivated isolate the strings that include those programmed selector memory cells $302_{D5}$ that are deactivated from the even bit lines 310, while the select transistors 304 coupled to those strings and the even bit lines are activated, for example. The strings 306, corresponding to odd bit lines 310, that contain programmed selector memory cells $302_{D6}$ that are activated and erased selector memory cells $302_{D5}$ that are activated are activated, and thus are selected, and are thus coupled to the corresponding odd bit lines 310.

The even bit lines (e.g. bit lines $310_2$, $310_4$, $310_6$, and $310_8$), and thus the strings 306 corresponding to the even bit lines might be selected, without selecting the odd bit lines (e.g. bit lines $310_1$, $310_3$, $310_5$, and $310_7$), and thus the strings 306 corresponding to even bit lines, by activating the row of selector memory cells $302_{D5}$ commonly coupled to selector word line $315_{D5}$, while the selector memory cells $302_{D6}$ commonly coupled to selector word line $315_{D6}$ that are in strings 306 corresponding to odd bit lines are deactivated and the selector memory cells $302_{D6}$ commonly coupled to selector word line $315_{D6}$ that are in strings 306 corresponding to even bit lines are activated.

For example, to select the even bit lines, and thus the strings 306 corresponding to the even bit lines, without selecting the odd bit lines, and thus the strings 306 corresponding to the odd bit lines, the voltage SEL0 might be Vcc, and the voltage SEL1 might be Vss. The voltage SEL0=Vcc activates the entire row of selector memory cells $302_{D5}$ (e.g., the programmed and erased memory cells $302_{D5}$) commonly coupled to selector word line $315_{D5}$. The voltage SEL1=Vss activates the erased selector memory cells $302_{D6}$ commonly coupled to selector word line $315_{D6}$, but is insufficient to activate the selector memory cells $302_{D6}$ commonly coupled to selector word line $315_{D6}$ that are programmed (e.g., the boxed selector memory cells $302_{D6}$). For example, the programmed selector memory cells $302_{D6}$ are deactivated, whereas the programmed selector memory cells $302_{D5}$ are activated. Therefore, the strings 306, corresponding to odd bit lines 310, that contain programmed selector memory cells $302_{D6}$ that are deactivated are isolated from their corresponding odd bit lines 310, and thus are unselected, whereas the strings 306, corresponding to even bit lines 310, that contain programmed selector memory cells $302_{D5}$ that are activated and erased selector memory cells $302_{D6}$ that are activated are activated, and thus are selected.

Figure 8:
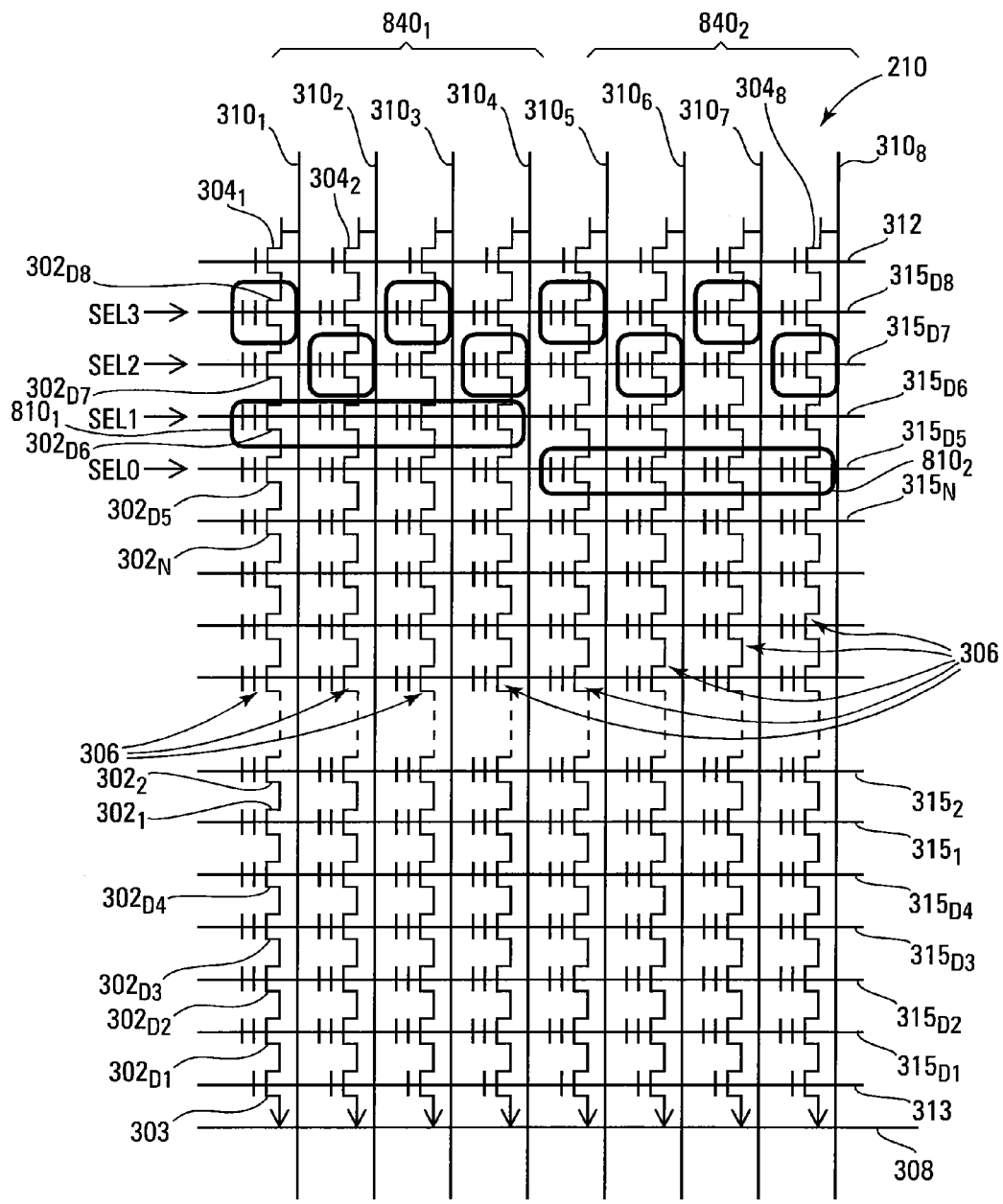
FIG. 8 is a schematic diagram of a memory block during the sensing of certain data lines of a certain portion of the memory block, according to another embodiment.

FIG. 8 is a schematic diagram of a memory block 210 during the sensing of certain selected (e.g., odd or even) bit lines in a certain selected portion of memory block 210. Therefore, the example in FIG. 8 is another example of distributed sensing, where the strings 306 corresponding to odd or even bit lines in a selected portion of memory block 210 are selected for sensing.

Memory block 210 might be a single selected memory block selected from a plurality of memory blocks, such as memory blocks $210_1$ to $210_4$ in FIG. 2. Common numbering is used in FIGS. 3 and 8 to denote similar (e.g., the same) components, e.g., where the commonly numbered components may be as described above in conjunction with FIG. 3.

A portion $840_1$ of the memory array 210 in the example of FIG. 8 might include the strings 306 respectively corresponding to bit lines $310_1$ to $310_4$, and a portion $840_2$ of the memory array 210 might include the strings 306 respectively corresponding to bit lines $310_5$ to $310_8$, for example. The odd or even bit lines 310, and thus the strings 306 corresponding to the odd or even bit lines 310, in portion $840_1$ or portion $840_2$ might be selected by selecting the odd or even bit lines for the entire block 210 and then selecting either portion $840_1$ or portion $840_2$. The odd or even selected bit lines 310 in a selected portion 840 might be sensed concurrently, for example.

The selector memory cells $302_{D7}$ and $302_{D8}$ respectively commonly coupled to selector word lines $315_{D7}$ and $315_{D8}$ that are enclosed in boxes might be programmed and might have, for example, a logic level zero, whereas the remaining selector memory cells $302_{D7}$ and $302_{D8}$ respectively commonly coupled to selector word lines $315_{D7}$ and $315_{D8}$ might be erased and might have, for example, a logic level one. The selector memory cells $302_{D6}$ that are enclosed in box $810_1$, that are commonly coupled to selector word line $315_{D6}$, and that are in strings 306 respectively corresponding to bit lines $310_1$ to $310_4$ might be programed and might have, for example, a logic level zero, whereas the remaining selector memory cells $302_{D6}$ that are commonly coupled to selector word line $315_{D6}$ and that are in strings 306 respectively corresponding to bit lines $310_5$ to $310_8$ might be erased and might have a logic level one. The selector memory cells $302_{D5}$ that are enclosed in box $810_2$, that are commonly coupled to selector word line $315_{D5}$, and that are in strings 306 respectively corresponding to bit lines $310_5$ to $310_8$ might be programed and might have, for example, a logic level zero, whereas the remaining selector memory cells $302_{D5}$ that are commonly coupled to selector word line $315_{D5}$ and that are in strings 306 respectively corresponding to bit lines $310_1$ to $310_4$ might be erased and might have a logic level one.

The programed and erased states of the selector memory cells $302_{D6}$ that are commonly coupled to selector word line $315_{D6}$ and the programed and erased states of the selector memory cells $302_{D5}$ that are commonly coupled to selector word line $315_{D5}$ in conjunction with the voltages SEL1 and SEL0 respectively applied to selector word lines $315_{D6}$ and $315_{D5}$ facilitates the selection of the portions $840_1$ and $840_2$ for sensing (e.g., reading). The programed and erased states of the selector memory cells $302_{D7}$ and $302_{D8}$ that are respectively coupled to selector word lines $315_{D7}$ and $315_{D8}$ in conjunction with the voltages SEL2 and SEL3 respectively applied to selector word lines $315_{D7}$ and $315_{D8}$ facilitates the selection of strings 306 corresponding to certain bit lines (e.g., odd or even bit lines) 310 for sensing (e.g., reading) in one of the portions $840_1$ or $840_2$ when that portion is selected. The voltages SEL1 and SEL0 might be respectively applied to selector word lines $315_{D6}$ and $315_{D5}$, and the voltages SEL2 and SEL3 might be respectively applied to selector word lines $315_{D7}$ and $315_{D8}$ while a read voltage is applied to selected word line $315_1$ in block 210 in FIG. 8, while the pass voltage is applied to unselected word lines $315_{D1}$ to $315_{D4}$, and $315_2$ to $315_N$ in block 210 in FIG. 8, and while an activation voltage is applied to select line 312 that activates the row (e.g., all) of the select transistors 304 commonly coupled to select line 312, for example.

To select portion $840_1$ without selecting portion $840_2$, the row of selector memory cells $302_{D6}$ commonly coupled to selector word line $315_{D6}$ is activated, while the selector memory cells $302_{D5}$ in strings 306 in portion $840_1$ (e.g., corresponding to bit lines $310_1$ to $310_4$) that are commonly coupled to selector word line $315_{D5}$ are activated and the selector memory cells $302_{D5}$ in strings 306 in portion $840_2$ (e.g., corresponding to bit lines $310_5$ to $310_8$) that are commonly coupled to selector word line $315_{D5}$ are deactivated.

For example, to select portion $840_1$ without selecting portion $840_2$, the voltage SEL0 might be a voltage, such as Vss, that is below the threshold voltages of the programmed selector memory cells $302_{D5}$ in box $810_2$ and above the threshold voltages of the erased (e.g., the unboxed) memory cells $302_{D5}$, whereas the voltage SEL1 might be a voltage, such as Vcc, that is above the threshold voltages of the programmed memory cells $302_{D6}$ in box $810_1$ and above the threshold voltages of the erased (e.g., the unboxed) memory cells $302_{D6}$. The voltage SEL1=Vcc activates the entire row of selector memory cells $302_{1)6}$ (e.g., the programmed and erased memory cells $302_{D6}$) commonly coupled to selector word line $315_{16}$. The voltage SEL0=Vss activates the erased selector memory cells $302_{D5}$ commonly coupled to selector word line $315_{D5}$, but is insufficient to activate the selector memory cells $302_{D5}$ commonly coupled to selector word line $315_{D5}$ that are programmed (e.g., the selector memory cells $302_{D5}$ in box $810_2$). For example, the programmed selector memory cells $302_{D5}$ are deactivated, whereas the programmed selector memory cells $302_{D6}$ are activated. As such, the strings 306 in portion $840_2$ are isolated from their respective bit lines, and portion $840_2$ is not selected, while portion $840_1$ is selected since the memory cells $302_{D6}$ commonly coupled to selector word line $315_{1)6}$ (e.g., the selector memory cells $302_{D6}$ in box $810_1$) are activated and since the erased memory cells $302_{D5}$ in portion $840_1$ commonly coupled to selector word line $315_{D5}$ (e.g., the unboxed memory cells $302_{D5}$) are activated. Note that the programmed selector memory cells $302_{D5}$ that are deactivated respectively isolate the strings 306 that include the selector memory cells $302_{D5}$ that are deactivated corresponding to bit lines $310_5$ to $310_8$ from bit lines $310_5$ to $310_8$ while the select transistors coupled between those strings 306 and bit lines $310_5$ to $310_8$ are activated.

To select portion $840_2$ without selecting portion $840_1$, the row of selector memory cells $302_{D5}$ commonly coupled to selector word line $315_{D5}$ is activated, while the selector memory cells $302_{D6}$ in strings 306 in portion $840_2$ (e.g., corresponding to bit lines $310_5$ to $310_8$) that are commonly coupled to selector word line $315_{D6}$ are activated and the selector memory cells $302_{D6}$ in strings 306 in portion $840_1$ (e.g., coupled bit lines $310_1$ to $310_4$) that are commonly coupled to selector word line $315_{D6}$ are deactivated.

For example, to select portion $840_2$ without selecting portion $840_1$, the voltage SEL1 might be a voltage, such as Vss, that is below the threshold voltages of the programmed memory cells $302_{D6}$ in box $810_1$ and above the threshold voltages of the erased (e.g., the unboxed) memory cells $302_{136}$, whereas the voltage SEL0 might be a voltage, such as Vcc, that is above the threshold voltages of the programmed memory cells $302_{D5}$ in box $810_2$ and above the threshold voltages of the erased (e.g., the unboxed) memory cells $302_{D5}$. The voltage SEL0=Vcc activates the entire row of selector memory cells $302_{D5}$ (e.g., the programmed and erased memory cells $302_{D5}$) commonly coupled to selector word line $315_{D5}$. The voltage SEL1=Vss activates the erased selector memory cells $302_{D6}$ commonly coupled to selector word line $315_{D6}$, but is insufficient to activate the selector memory cells $302_{D6}$ commonly coupled to selector word line $315_{D6}$ that are programmed (e.g., the selector memory cells $302_{D6}$ in box $810_1$). For example, the programmed selector memory cells $302_{D6}$ are deactivated, whereas the programmed selector memory cells $302_{D5}$ are activated. As such, the strings 306 in portion $840_1$ are isolated for their respective bit lines and portion $840_1$ portion is not selected, while portion $840_2$ is selected since the memory cells $302_{D5}$ in portion $840_2$ commonly coupled to selector word line $315_{D5}$ (e.g., the selector memory cells $302_{D5}$ in box $810_2$) are activated and since the erased memory cells $302_{D6}$ in portion $840_2$ commonly coupled to selector word line $315_{D6}$ (e.g., the unboxed memory cells $302_{D6}$) are activated.

The odd bit lines (e.g., bit lines $310_1$, $310_3$, $310_5$, and $310_7$), and thus the strings 306 corresponding to the odd bit lines, might be selected, without selecting the even bit lines (e.g., bit lines $310_2$, $310_4$, $310_6$, and $310_8$), and thus the strings 306 corresponding to the even bit lines, by activating the row of selector memory cells $302_{D8}$ commonly coupled to selector word line $315_{D8}$, while the selector memory cells $302_{D7}$ commonly coupled to selector word line $315_{D7}$ that are in strings 306 corresponding to even bit lines are deactivated and the selector memory cells $302_{D7}$ commonly coupled to selector word line $315_{D7}$ that are in strings 306 corresponding to odd bit lines are activated. With the odd bit lines (e.g., bit lines $310_1$, $310_3$, $310_5$, and $310_7$) thus selected, the odd bit lines (e.g., bit lines $310_1$ and $310_3$) corresponding to strings 306 in portion $840_1$ might be selected by selecting portion $840_1$, or the odd bit lines (e.g., bit lines $310_5$ and $310_7$) corresponding to strings 306 in portion $840_2$ might be selected by selecting portion $840_2$.

For example, to select the odd bit lines, and thus the strings 306 corresponding to the odd bit lines, without selecting the even bit lines, and thus the strings 306 corresponding to the even bit lines, the voltage SEL2 might be a voltage, such as Vss, that is below the threshold voltages of the programmed (e.g., the boxed) memory cells $302_{D7}$ and above the threshold voltages of the erased (e.g., the unboxed) memory cells $302_{D7}$, whereas the voltage SEL3 might be a voltage, such as Vcc, that is above the threshold voltages of the programmed memory cells and $302_{D8}$ and above the threshold voltages of the erased memory cells $302_{D8}$. The voltage SEL3=Vcc activates the entire row of selector memory cells $302_{D8}$ (e.g., the programmed and erased memory cells $302_{D8}$) commonly coupled to selector word line $315_{D8}$. The voltage SEL2=Vss activates the erased selector memory cells $302_{D7}$ commonly coupled to selector word line $315_{D7}$, but is insufficient to activate the selector memory cells $302_{D7}$ commonly coupled to selector word line $315_{D7}$ that are programmed (e.g., the boxed selector memory cells $302_{D7}$). Therefore, the strings 306, corresponding to even bit lines 310, that contain programmed selector memory cells $302_{D7}$ that are deactivated are isolated from their corresponding even bit lines 310, and thus are unselected, whereas the strings 306, corresponding to odd bit lines 310, that contain programmed selector memory cells $302_{D8}$ that are activated and erased selector memory cells $302_{D7}$ that are activated are activated, and thus are selected.

The even bit lines (e.g., bit lines $310_2$, $310_4$, $310_6$, and $310_8$), and thus the strings 306 corresponding to the even bit lines, might be selected, without selecting the odd bit lines (e.g., bit lines $310_1$, $310_3$, $310_5$, and $310_7$), and thus the strings 306 corresponding to the odd bit lines, by activating the row of selector memory cells $302_{D7}$ commonly coupled to selector word line $315_{D7}$, while the selector memory cells $302_{D8}$ commonly coupled to selector word line $315_{D8}$ that are in strings 306 coupled to odd bit lines are deactivated and the selector memory cells $302_{D8}$ commonly coupled to selector word line $315_{D8}$ that are in strings 306 coupled to even bit lines are activated. With the even bit lines (e.g., bit lines $310_2$, $310_4$, $310_6$, and $310_8$) thus selected, the even bit lines (e.g., bit lines $310_2$ and $310_4$) corresponding to strings 306 in portion $840_1$ might be selected by selecting portion $840_1$, or the even bit lines (e.g., bit lines $310_6$ and $310_8$) corresponding to strings 306 in portion $840_2$ might be selected by selecting portion $840_2$.

For example, to select the even bit lines, and thus the strings 306 corresponding to the even bit lines, without selecting the odd bit lines, and thus the strings 306 corresponding to the odd bit lines, the voltage SEL2 might be Vcc, and the voltage SEL3 might be Vss. The voltage SEL2=Vcc activates the entire row of selector memory cells $302_{D7}$ (e.g., the programmed and erased memory cells $302_{D7}$) commonly coupled to selector word line $315_{D7}$. The voltage SEL3=Vss activates the erased selector memory cells $302_{D8}$ commonly coupled to selector word line $315_{D8}$, but is insufficient to activate the selector memory cells $302_{D8}$ commonly coupled to selector word line $315_{D8}$ that are programmed (e.g., the boxed selector memory cells $302_{D8}$). Therefore, the strings 306, corresponding to odd bit lines 310, that contain programmed selector memory cells $302_{D8}$ that are deactivated are isolated from their corresponding odd bit lines 310, and thus are unselected, whereas the strings 306, corresponding to even bit lines 310, that contain programmed selector memory cells $302_{D7}$ that are activated and erased selector memory cells $302_{D8}$ that are activated are activated, and thus are selected.

In the examples discussed above in conjunction with FIGS. 3-5, data from a portion 240 of a block might be output to (e.g., sensed by) a respective one of portions 250 of page buffer 220. For example, data (e.g., four kilobytes of user data plus the ECC for that data) from portion $240_1$ of memory block $210_4$, portion $240_2$ of memory block $210_2$, portion $240_3$ of memory block $210_3$, and portion $240_4$ of memory block $210_1$ might be respectively output to (e.g., sensed by) portions $250_1$, $250_2$, $250_3$, and $250_4$ of page buffer 220. However, for some embodiments, data (e.g., one kilobyte of user data plus the ECC for that data) from a portion of each of a plurality blocks might be output to one portion 250 (e.g., portion $250_1$) of page buffer 220, data (e.g., one kilobyte of user data plus the ECC for that data) from another portion of each of the plurality blocks might be output to another portion 250 (e.g., portion $250_2$) of page buffer 220, etc. That is, instead of each portion 250 of page buffer 220 having data from the same memory block, each portion 250 of page buffer 220 might have data from portions of different blocks, for example. This can be illustrated by the example of FIG. 9.

Figure 9:
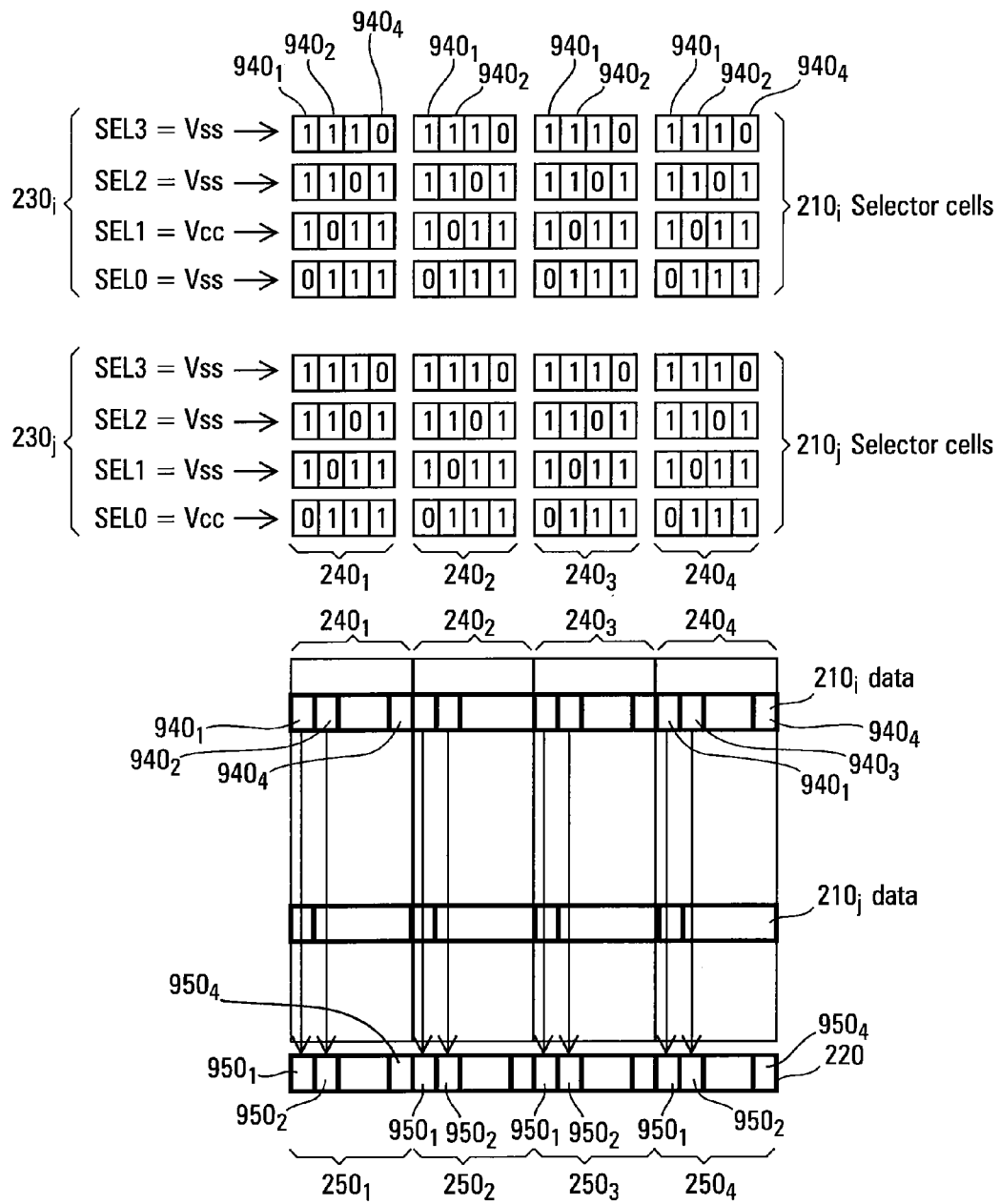
FIG. 9 is a block diagram illustrating reading portions of different blocks of a memory array, according to another embodiment.

In the example of FIG. 9, the memory blocks $210_i$ and $210_j$ might be as described above in conjunction with the example of FIG. 3 or of FIG. 4, e.g., memory blocks $210_i$ and $210_j$ might form a portion of memory array 200 in FIG. 2. In FIG. 9, each of the portions $240_1$ to $240_4$ of memory blocks $210_i$ and $210_j$ might have a plurality of sub-portions, such as sub-portions $940_1$ to $940_4$. Note that the selector memory cells in the sub-portions 940 of each portion 240 in FIG. 9 might be programmed (e.g., assigned all logic zeros) or erased (e.g., assigned all logic ones).

Each of the portions $250_1$ to $250_4$ of page buffer 220 might have a plurality of sub-portions 950, such as sub-portions $950_1$ to $950_4$. For example, sub-portions $950_1$ to $950_4$ in portion $250_1$ might respectively correspond to sub-portions $940_1$ to $940_4$ in portion $240_1$; sub-portions $950_1$ to $950_4$ in portion $250_2$ might respectively correspond to sub-portions $940_1$ to $940_4$ in portion $240_2$; etc. Each portion 250 might sense four kilobytes of user data plus ECC, for example, while each sub-portion 950 might sense one kilobyte of user data plus ECC, for example.

Sets $230_i$ and $230_j$ of voltages SEL0 to SEL3 might be respectively applied to the selector word lines of memory blocks $210_i$ and $210_j$ while a read voltage is applied to a selected word line (e.g., selected word line $315_1$) in each of memory blocks $210_i$ and $210_j$ and a pass voltage is applied to unselected word lines (e.g., unselected word lines $315_{D1}$, $315_{D2}$, $315_{D7}$, $315_{D8}$, and $315_2$ to $315_N$) in each of memory blocks $210_i$ and $210_j$. For example, applying set $230_i$ to the selector word lines coupled to the selector memory cells of memory block $210_i$ allows data from sub-portion $940_2$ of portions $240_1$ to $240_4$ of block $210_i$ to be respectively sensed by sub-portion $950_2$ of portions $250_1$ to $250_4$ of page buffer 220, and applying set $230_j$ to the selector word lines coupled to the selector memory cells of memory block $210_j$ allows data from sub-portion $940_1$ of portions $240_1$ to $240_4$ of block $210_j$ to be respectively sensed by sub-portion $950_1$ of portions $250_1$ to $250_4$ of page buffer 220.

The sub-portions $940_2$ of each of the portions 240 of block $210_i$ might have the same page address, and the sub-portions $940_1$ of each of the portions 240 of block $210_j$ might have the same page address. For example, sub-portions $940_2$ of each of the portions 240 of block $210_i$ might have the same page address as the sub-portions $940_1$ of each of the portions 240 of block $210_j$ so that the data from the sub-portions $940_2$ of each of the portions 240 of block $210_i$ and the data from the sub-portions $940_1$ of each of the portions 240 of block $210_j$ is sensed concurrently at the portions 250 of page buffer 220. That is, the data in sub-portions $950_1$ of portions 250 of page buffer 220 and the data in sub-portions $950_2$ of portions 250 of page buffer 220 may sensed concurrently, for example, in response to a sense amplifier enable signal commonly received at sub-portions $950_1$ and sub-portions $950_2$.

Alternatively, for example, sub-portions $940_2$ of each of the portions 240 of block $210_i$ might have a different page address than the sub-portions $940_1$ of each of the portions 240 of block $210_j$, so that the data from the sub-portions $940_2$ of each of the portions 240 of block $210_i$ are sensed concurrently at the portions 250 of page buffer 220 at a first time and the data from the sub-portions $940_1$ of each of the portions 240 of block $210_j$ are sensed concurrently at the portions 250 of page buffer 220 at a second time different than the first time. That is, the data in sub-portions $950_1$ of portions 250 of page buffer 220 might be sensed concurrently in response to a sense amplifier enable signal commonly received at sub-portions $950_1$, for example, and the data in sub-portions $950_2$ of portions 250 of page buffer 220 might be sensed concurrently in response to a different sense amplifier enable signal commonly received at sub-portions $950_2$, for example.

Figure 10:
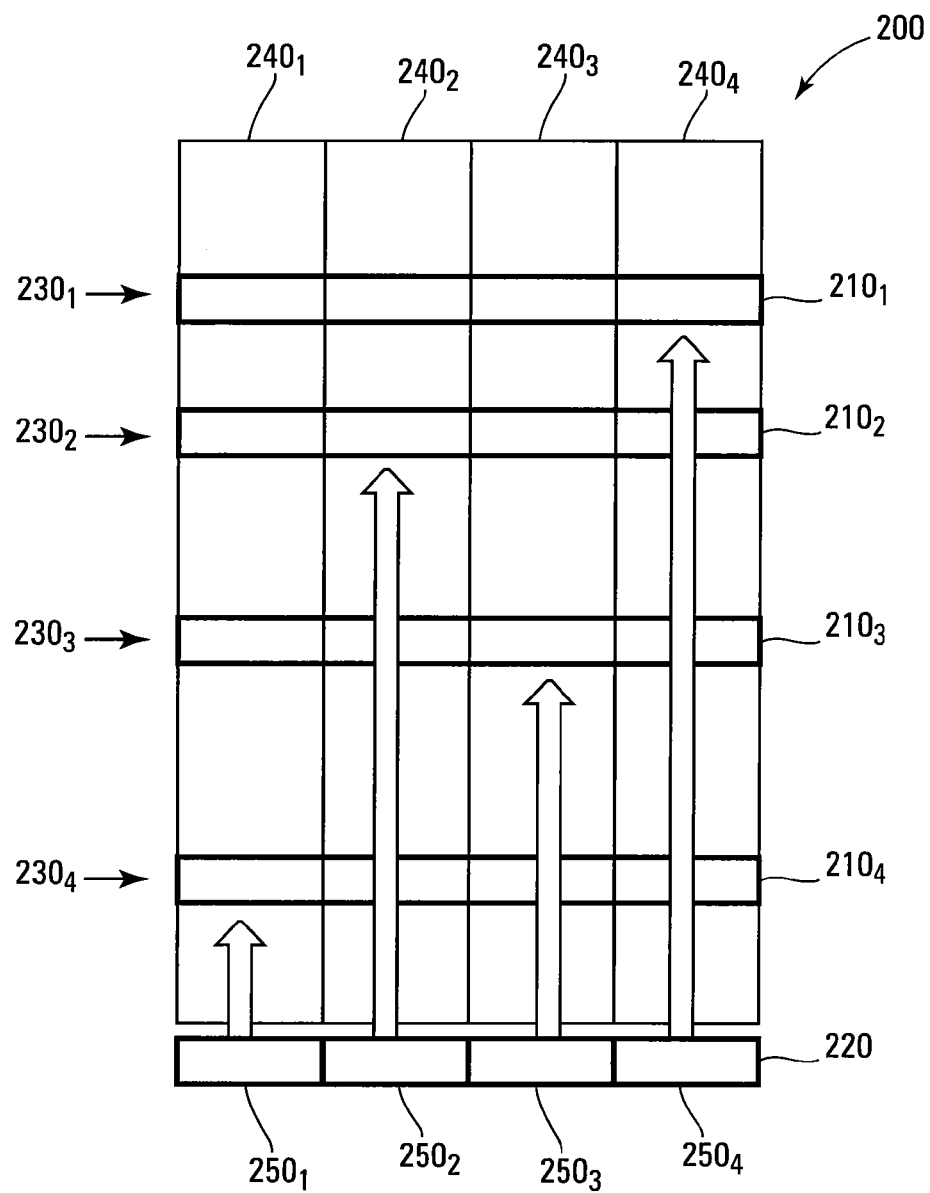
FIG. 10 is a block diagram illustrating a memory array, during a programming operation, according to another embodiment.

FIG. 10 is a block diagram illustrating a memory array 200, during a programming operation. Each of the memory blocks $210_1$ to $210_4$ may be as described above in conjunction with FIG. 3 or FIG. 4. The selector memory cells in memory blocks $210_1$ to $210_4$ might be programmed as shown in FIG. 5A, for example. The sets $230_1$ to $230_4$ of voltages SEL0 to SEL3 from FIG. 5A might be respectively applied to the selector word lines, and thus the selector memory cells, of memory blocks $210_1$ to $210_4$. For example, voltages SEL0 to SEL3 might be respectively applied to the selector word lines $315_{D3}$ to $315_{D6}$ in each block 210, as shown in FIG. 5A. As such, the states of the memory cells, in response to applying the sets $230_1$ to $230_4$ of voltages SEL0 to SEL3 to the selector word lines, might be as shown in FIG. 5A, where all of the erased selector memory cells (e.g., having logic level one in FIG. 5A) are activated (e.g., conducting).

During a programming operation, with reference to FIG. 3 or 4, one of the word lines $315_1$ to $315_N$, e.g., word line $315_1$, in each of the memory blocks 210 might be selected for programming, for example, while the remaining word lines $315_{D1}$, $315_{D2}$, $315_{D7}$, $315_{D8}$, and $315_2$ to $315_N$ in each of the memory blocks 210 might be unselected. Memory cells $302_1$ (e.g., one or more memory cells $302_1$) in portions $240_4$, $240_2$, $240_3$, and $240_1$ respectively in blocks $210_1$, $210_2$, $210_3$, and $210_4$ and commonly coupled to selected word lines $315_1$ might be target memory cells targeted for programming. As such, the portions $240_4$, $240_2$, $240_3$, and $240_1$ respectively in blocks $210_1$, $210_2$, $210_3$, and $210_4$ might be referred to as selected portions, e.g., that might be selected concurrently. The remaining portions 240 in each of the blocks 210, e.g., portions $240_1$ to $240_3$ in block $210_1$, portions $240_1$, $240_3$, and $240_4$ in block $210_2$, portions $240_1$, $240_2$, and $240_4$ in block $210_3$, and portions $240_2$ to $240_4$ in block $210_4$, might be unselected portions. Therefore, the remaining memory cells $302_1$ commonly coupled to the selected word line $315_1$ in the unselected portions of each block 210 are untargeted memory cells $302_1$ not targeted for programming.

The selector memory cells in selected portions $240_4$, $240_2$, $240_3$, and $240_1$ respectively in blocks $210_1$, $210_2$, $210_3$, and $210_4$ that are programed (e.g., are assigned logic level zero in FIG. 5A) and are activated in response to the selector memory cells in blocks $210_1$, $210_2$, $210_3$, and $210_4$ respectively receiving sets $230_1$, $230_2$, $230_3$, and $230_4$. This selects portions $240_4$, $240_2$, $240_3$, and $240_1$ respectively in blocks $210_1$, $210_2$, $210_3$, and $210_4$, in that the erased selector memory cells in selected portions $240_4$, $240_2$, $240_3$, and $240_1$ respectively in blocks $210_1$, $210_2$, $210_3$, and $210_4$ are also activated in response to the selector memory cells in blocks $210_1$, $210_2$, $210_3$, and $210_4$ respectively receiving sets $230_1$, $230_2$, $230_3$, and $230_4$. The selector memory cells in the unselected portions in each of blocks 210 are also programed (e.g., are assigned logic level zero), but remain deactivated (non-conducting) in response to those selector memory cells in blocks $210_1$, $210_2$, $210_3$, and $210_4$ respectively receiving sets $230_1$, $230_2$, $230_3$, and $230_4$.

Applying the sets $230_1$ to $230_4$ respectively to the selector memory cells in blocks $210_1$ to $210_4$ as programed in FIG. 5A, selects the portions $240_4$, $240_2$, $240_3$, and $240_1$ respectively of blocks $210_1$, $210_2$, $210_3$, and $210_4$ for programming while leaving the remaining portions in each of blocks $210_1$, $210_2$, $210_3$, and $210_4$ unselected for programming. For example, the sets $230_1$ to $230_4$ might be respectively applied to the selector word lines in blocks $210_1$ to $210_4$, e.g., concurrently while a program pass voltage is applied to the unselected word lines $315_{D1}$, $315_{D2}$, $315_{D7}$, $315_{D8}$, and $315_2$ to $315_N$ in blocks $210_1$ to $210_4$, e.g., concurrently, while a voltage, such as Vss, is applied to bit lines 310 (FIG. 3 or 4), e.g., concurrently, and while the row of select transistors 304, commonly coupled to select line 312 and respectively coupled between the bit lines 310 and the strings 306 in each of blocks $210_1$ to $210_4$, is activated, e.g., concurrently in blocks $210_1$ to $210_4$, e.g., in response to a voltage, such as Vcc, being applied to each select line 312.

A program voltage might be applied to the selected word line $315_1$ in each of blocks 210 while the sets $230_1$ to $230_4$ are respectively to the selector memory cells in blocks $210_1$ to $210_4$, e.g., concurrently, while the program pass voltage is applied to the unselected word lines $315_{D1}$, $315_{D2}$, $315_{D7}$, $315_{D8}$, and $315_2$ to $315_N$ in each of blocks 210, while the select transistors 304 are activated, and while the voltage Vss is applied to bit lines 310. Note that in the event that some of the target memory cells $302_1$ program before others, an inhibit voltage, such as Vcc, might be applied to the bit lines 310 coupled to the stings 306 containing those memory cells.

The programmed selector memory cells that are activated (e.g., conducting) in each of the blocks 210 in FIG. 5A allow the strings 306 (FIGS. 3 and 4) of memory cells that include an activated selector memory cell and a target memory cell to conduct and to be coupled to the bit lines 310 by the activated select transistors 304. For example, the strings 306 of memory cells in portion $240_4$ of memory block $210_1$, the strings 306 of memory cells in portion $240_2$ of memory block $210_2$, the strings 306 of memory cells in portion $240_3$ of memory block $210_3$, and the strings 306 of memory cells in portion $240_1$ of memory block $210_4$ are activated.

An activated programmed selector memory cell and an activated select transistor 304 couple a bit line 310 to a channel of a target memory cell $302_1$ in the string 306 with the activated selector memory cell (e.g., to a channel of the string 306 that includes the target memory cell $302_1$ and the activated selector memory cell) and act to maintain the channel at about the voltage, e.g., Vss, of the bit line 310, thereby preventing the pass voltage applied to unselected word lines $315_{D1}$, $315_{D2}$, $315_{D7}$, $315_{D8}$, and $315_2$ to $315_N$ and the program voltage applied to selected word line $315_1$ from increasing (e.g., boosting) the voltage of the channel. As such, the difference between the program voltage applied to selected word line $315_1$ and the voltage on channel, and thus the voltage difference across the charge-storage structure 334 (FIG. 3) of the target memory cell $302_1$, is sufficient to produce a change in the threshold (Vt) level of the target memory cell $302_1$.

The deactivated programmed selector memory cells in each of the blocks 210 in FIG. 5A electrically isolate the strings 306 (FIGS. 3 and 4) that include those deactivated selector memory cells from the bit lines 310 coupled to the activated select transistors 304 and those strings 306. For example, the strings 306 of memory cells in portions $240_1$, $240_2$, and $240_3$ of memory block $210_1$ are electrically isolated from the bit lines 310 that are coupled to the activated select transistors 304 in memory block $210_1$ that are coupled to the strings 306 of memory cells in portions $240_1$, $240_2$, and $240_3$ of memory block $210_1$; the strings 306 of memory cells in portions $240_1$, $240_3$, and $240_4$ of memory block $210_2$ are electrically isolated from the bit lines 310 that are coupled to the activated select transistors 304 in memory block $210_2$ that are coupled to the strings 306 of memory cells in portions $240_1$, $240_3$, and $240_4$ of memory block $210_2$; the strings 306 of memory cells in portions $240_1$, $240_2$, and $240_4$ of memory block $210_3$ are electrically isolated from the bit lines 310 that are coupled to the activated select transistors 304 in memory block $210_3$ that are coupled to the strings 306 of memory cells in portions $240_1$, $240_2$, and $240_4$ of memory block $210_3$; and the strings 306 of memory cells in portions $240_2$, $240_3$, and $240_4$ of memory block $210_4$ are electrically isolated from the bit lines 310 that are coupled to the activated select transistors 304 in memory block $210_4$ that are coupled to the strings 306 of memory cells in portions $240_2$, $240_3$, and $240_4$ of memory block $210_4$.

A deactivated programmed selector memory cell prevents a voltage (e.g., a boosted voltage) on the channel of the memory cells in a string 306, including the deactivated selector memory cell and an untargeted memory cell $302_1$ coupled to the selected word line $315_1$, from discharging through an activated select transistor 304 coupled to a bit line 310, e.g., at the voltage Vss, coupled to the select transistor 304. That is, the voltage of channel might be boosted by pre-charge operations and by the pass voltage applied to unselected word lines $315_{D1}$, $315_{D2}$, $315_{D7}$, $315_{D8}$, and $315_2$ to $315_N$ and the program voltage applied to selected word line $315_1$, for example. As such, the difference between the program voltage applied to selected word line $315_1$ and the voltage on channel of the untargeted memory cell $302_1$, and thus the voltage difference across the charge-storage structure 334 of the untargeted memory cell $302_1$ coupled to the selected word line $315_1$, is insufficient to produce a change in the Vt level of the untargeted memory cell $302_1$ coupled to the selected word line $315_1$. That is, the Vt of the untargeted memory cell $302_1$ is inhibited from being changed by the program voltage.

A deactivated programmed selector memory cell allows an untargeted memory cell included in the same string in an unselected portion of a block to be inhibited while the Vt of a targeted memory cell in another string, including an activated selector memory cell, in a selected portion of another block is shifted, where the untargeted and targeted memory cells are coupled to different selected word lines that receive the program voltage and where the string that includes the untargeted memory cell and the string that includes the targeted memory cell are both coupled by activated select gates to the same bit line that is at a voltage, such as Vss, sufficient to allow the Vt of the target memory cell to shift when the selected word line coupled to the target memory cell is at the program voltage. For example, the inhibiting of an untargeted memory cell in a string may be controlled by the state of a selector memory cells in the same string and the voltage of the channel of the untargeted memory cell when a program voltage is applied to a selected word line coupled to the untargeted memory cell, and may be independent of the voltage of a bit line coupled to the string by an activated select gate while the program voltage is applied to the selected word line.

Figure 11:
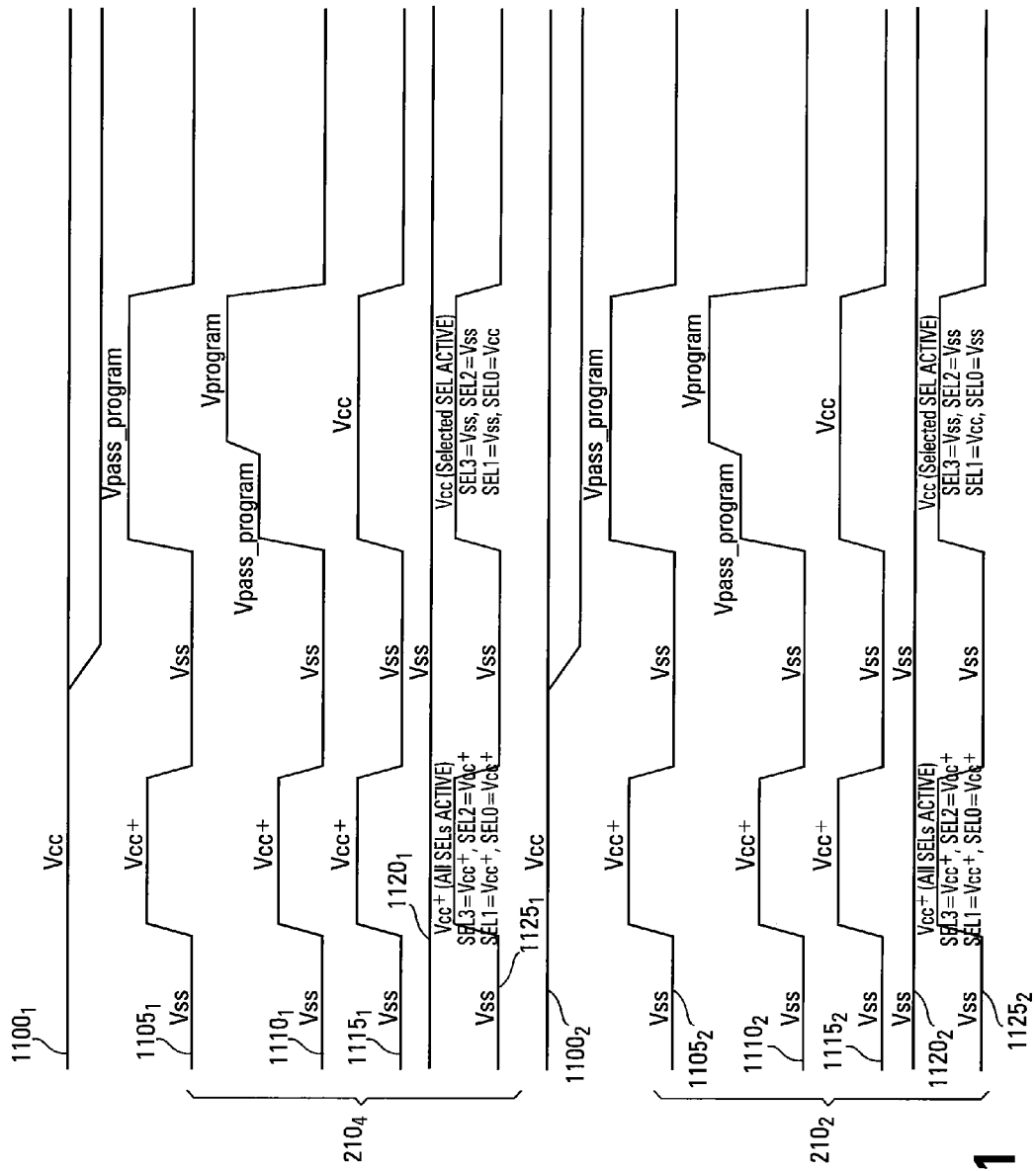
FIG. 11 illustrates a timing diagram for a programming operation, according to another embodiment.

FIG. 11 presents a timing diagram for an example where portion $240_1$ of block $210_4$ and portion $240_2$ of block $210_2$ are programmed concurrently. Voltages $1100_1$ and $1100_2$ are respectively applied to the bit lines coupled to portions $250_1$ and $250_2$ of page buffer 220 in FIG. 10. Voltages $1105_1$ and $1105_2$ are respectively applied to unselected word lines (e.g., unselected word lines $315_{D1}$, $315_{D2}$, $315_m$, $315_{D8}$, and $315_2$ to $315_N$, FIGS. 3 and 4) of blocks $210_4$ and $210_2$. Voltages $1110_1$ and $1110_2$ are respectively applied to selected word lines (e.g., selected word line $315_1$, FIGS. 3 and 4) of blocks $210_4$ and $210_2$. Voltages $1115_1$ and $1115_2$ are respectively applied to select lines 312 (e.g., the drain select lines) of blocks $210_4$ and $210_2$. Voltages $1120_1$ and $1120_2$ are respectively applied to select lines 313 (e.g., the source select lines) of blocks $210_4$ and $210_2$. The voltages 1120 may be maintained at a voltage level, such as Vss, that is insufficient to activate the select transistors 303 (e.g., the source select transistors) coupled select lines 313 during the programming operation. Voltages $1125_1$ and $1125_2$ are respectively applied to the selector word lines $315_{D3}$, $315_{D4}$, $315_{D5}$, and $315_{D6}$ of memory blocks $210_4$ and $210_2$ (FIGS. 3, 4, and 5).

The voltages 1100 applied to the bit lines are initially at a voltage level, such as voltage level Vcc, sufficient to inhibit programming. While the voltages 1100 of the bit lines are at Vcc, the voltages 1115 applied to the drain select lines, the voltages 1105 applied to the unselected word lines, the voltages 1110 applied to the selected word lines, and the voltages 1125 applied to the selector word lines are increased from a voltage level, such as Vss, e.g., to a voltage level greater than Vcc, such as Vcc+. This acts to pre-charge the channels of the strings of memory cells in portion $240_1$ of block $210_4$, corresponding to the bit lines coupled to portion $250_1$ of page buffer 220, and to pre-charge the channels of the strings of memory cells in portion $240_2$ of block $210_2$, corresponding to the bit lines coupled to portion $250_2$ of page buffer 220. Note that the voltages SEL0, SEL1, SEL2, and, SEL3 respectively applied to the selector word lines $315_{D3}$, $315_{E4}$, $315_{D5}$, and $315_{D6}$ (FIG. 5A) of memory blocks $210_4$ and $210_2$ are now at Vcc+.

Subsequently, while the voltages 1100 of the bit lines are at Vcc, the voltages 1115 applied to the drain select lines are decreased from Vcc+ to Vss, deactivating the drain select transistors coupled thereto, and the voltages 1105 applied to the unselected word lines, the voltages 1110 applied to the selected word lines, and the voltages 1125 applied to the selector word lines are decreased from Vcc+ to Vss. After this, the voltages 1100 applied to bit lines that correspond to strings of memory cells in portion $240_1$ of block $210_4$ and in portion $240_2$ of block $210_2$, having memory cells that are targeted for programming coupled to selected word lines, are decreased from Vcc to a voltage level, such as Vss. However, the voltages 1100 applied to bit lines that correspond to strings of memory cells in portion $240_1$ of block $210_4$ and in portion $240_2$ of block $210_2$, having memory cells that are not targeted for programming coupled to selected word lines, remain at Vcc, so that the memory cells coupled to selected word lines that are not targeted for programming are inhibited from being programed.

While the voltages applied to the bit lines that correspond to strings of memory cells having memory cells that are targeted for programming are at Vss, the voltages 1115 applied to the drain select lines are increased from Vss to Vcc, activating the drain select transistors coupled thereto, and the voltages 1105 applied to the unselected word lines and the voltages 1110 applied to the selected word lines are increased from Vss to a pass voltage level, such as voltage level Vpass_program.

While the voltages 1115 applied to the drain select lines are being increased from Vss to Vcc and the voltages 1105 applied to the unselected word lines and the voltages 1110 applied to the selected word lines are being increased from Vss to Vpass_program, the voltage $1125_1$ applied to the selector word line $315_{D3}$ in block $210_4$ (e.g., corresponding to the voltage SEL0 in FIGS. 5A and 11) and the voltage $1125_2$ applied to the selector word line $315_{D4}$ in block $210_2$ (corresponding to the voltage SEL1 in FIGS. 5A and 11) are increased from Vss to Vpass so that the selector memory cells coupled to selector word line $315_{D3}$ in block $210_4$ and to selector word line $315_{D4}$ in block $210_2$ are activated (e.g., on). The strings of memory cells that include an activated selector memory cell and a target memory cell are coupled to the bit lines at Vss by the activated drain select transistors.

While the voltage $1125_1$ applied to selector word line $315_{D3}$ in block $210_4$ and the voltage $1125_2$ applied to selector word line $315_{D4}$ in block $210_2$ are being increased from Vss to Vcc, the voltages $1125_1$ applied to the selector word lines $315_{D4}$, $315_{D5}$, and $315_{D6}$ in block $210_4$ (e.g., corresponding to the voltages SEL1, SEL2, and, SEL3 in FIGS. 5A and 11) and the voltages $1125_2$ applied to selector word lines $315_{D3}$, $315_{D5}$, and $315_{D6}$ in block $210_2$ (e.g., corresponding to the voltages SEL0, SEL2, and, SEL3 in FIGS. 5A and 11) are maintained at Vss. This causes the selector memory cells coupled to the selector word lines $315_{D4}$, $315_{D5}$, and $315_{D6}$ respectively in portions $240_2$, $240_3$, and $240_4$ in block $210_4$ and the selector memory cells coupled to the selector word lines $315_{D3}$, $315_{D5}$, and $315_{D6}$ respectively in portions $240_1$, $240_3$, and $240_4$ in block $210_2$ to be deactivated (e.g., off, FIG. 5A).

Subsequently, the voltages 1110 applied to the selected word lines in blocks $210_4$ and $210_2$ are increased from Vpass_program to a programming voltage level, such as Vprogram, while the voltages 1100 applied to the bit lines coupled to strings of memory cells having target memory cells are at Vss, the voltages 1105 applied to the unselected word lines are at Vpass_program, the voltages 1115 applied to the drain select lines are at Vcc, and the voltages $1125_1$ and $1125_2$ respectively applied to the selector word line $315_{D3}$ in block $210_4$ and the selector word line $315_{D4}$ in block $210_2$ are at Vcc.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory device, comprising:
   sensing a target memory cell in a first block of memory cells and a target memory cell in a second block of memory cells concurrently while applying a read voltage to a selected access line coupled to the target memory cell in the first block of memory cells and while applying a read voltage to another selected access line coupled to the target memory cell in the second block of memory cells;
   wherein the target memory cell in the first block of memory cells and a memory cell in the second block of memory cells are each selectively coupled to a first data line; and
   wherein the target memory cell in the second block of memory cells and a memory cell in the first block of memory cells are each selectively coupled to a second data line.

2. The method of claim 1, wherein sensing the target memory cell in the first block of memory cells and the target memory cell in the second block of memory cells concurrently comprises sensing the first data line selectively coupled to the target memory cell in the first block of memory cells and the second data line selectively coupled to the target memory cell in the second block of memory cells concurrently.

3. The method of claim 2, wherein the first data line is coupled to an activated select transistor coupled to a string of memory cells in the second block of memory cells, wherein the string of memory cells in the second block of memory cells comprises the memory cell in the second block of memory cells and wherein the memory cell in the second block of memory cells comprises an untargeted memory cell coupled to the selected access line coupled to the target memory cell in the second block of memory cells and a selector memory cell that isolates the untargeted memory cell from the first data line.

4. The method of claim 3, wherein the selector memory cell that isolates the untargeted memory cell from the first data line is coupled to a selector access line in the second block of memory cells that receives a voltage that is insufficient to activate the selector memory cell.

5. The method of claim 4, wherein the selector memory cell that isolates the untargeted memory cell from the first data line inhibits current from flowing through the untargeted memory cell to the first data line.

6. The method of claim 3, wherein the first data line is coupled to an activated select transistor coupled to a string of memory cells in the first block of memory cells, wherein the string of memory cells in the first block of memory cells comprises the target memory cell in the first block of memory cells and a selector memory cell that receives a voltage that activates the selector memory cell.

7. The method of claim 1, further comprising addressing the target memory cell in the first block of memory cells and the target memory cell in the second block of memory cells with a common page address.

8. A method of operating a memory device, comprising:
applying a first activation voltage to a first select line in a first block of memory cells that activates first and second select transistors in the first block of memory cells commonly coupled to the first select line, wherein the first select transistor is coupled to a first string of memory cells in the first block of memory cells and to a first data line and the second select transistor is coupled to a second string of memory cells in the first block of memory cells and to a second data line;
while applying the first activation voltage, applying a second activation voltage to a second select line in a second block of memory cells that activates third and fourth select transistors in the second block of memory cells commonly coupled to the second select line, wherein the third select transistor is coupled to a third string of memory cells in the second block of memory cells and to the first data line and the fourth select transistor is coupled to a fourth string of memory cells in the second block of memory cells and to the second data line;
coupling the first string of memory cells to the first data line while isolating the third string of memory cells from the first data line and while applying the first and second activation voltages; and
coupling the fourth string of memory cells to the second data line while isolating the second string of memory cells from the second data line, and while applying the first and second activation voltages;
wherein a selector memory cell in the third string of memory cells that is deactivated isolates the third string of memory cells from the first data line and a selector memory cell in the second string of memory cells that is deactivated isolates the second string of memory cells from the second data line.

9. The method of claim 8, wherein coupling the fourth string of memory cells to the second data line occurs while coupling the first string of memory cells to the first data line and while isolating the third string of memory cells from the first data line.

10. The method of claim 8, wherein the selector memory cell in the third string of memory cells and the selector memory cell in the second string of memory cells are not used to store user data or ECC.

11. The method of claim 8, further comprising:
applying a first read voltage to a selected access line commonly coupled to a target memory cell in the first string of memory cells and to an untargeted memory cell in the second string of memory cells while the first string is coupled to the first bit line; and
while applying the first read voltage, applying a second read voltage to another selected access line commonly coupled to an untargeted memory cell in the third string of memory cells and to a target memory cell in the fourth string of memory cells while the fourth string is coupled to the second bit line.

12. The method of claim 11, wherein target memory cell in the first string of memory cells and the target memory cell in the fourth string of memory cells are addressed by a common page address.

13. The method of claim 8, further comprising:
applying a first program voltage to a selected access line commonly coupled to a target memory cell in the first string of memory cells and to an untargeted memory cell in the second string of memory cells while the first string is coupled to the first data line; and
while applying the first program voltage, applying a second program voltage to another selected access line commonly coupled to an untargeted memory cell in the third string of memory cells and to a target memory cell in the fourth string of memory cells while the fourth string is coupled to the second data line.

14. The method of claim 13, wherein the selector memory cell in the second string of memory cells that is deactivated maintains a voltage on a channel of the untargeted memory cell in the second string of memory cells that inhibits the untargeted memory cell in the second string of memory cells from being programmed, and wherein the selector memory cell in the third string of memory cells that is deactivated maintains a voltage on a channel of the untargeted memory cell in the third string of memory cells that inhibits the untargeted memory cell in the third string of memory cells from being programmed.

15. The method of claim 8, further comprising, while applying the first and second activation voltages:
applying a first voltage to a first selector access line that is commonly coupled to a selector memory cell in the first string of memory cells and the selector memory cell in the second string of memory cells, wherein the first voltage activates the selector memory cell in the first string of memory cells and is insufficient to activate the selector memory cell in the second string of memory cells; and
applying a second voltage to a second selector access line that is commonly coupled to the selector memory cell in the third string of memory cells and a selector memory cell in the fourth string of memory cells wherein the second voltage activates the selector memory cell in the fourth string of memory cells and is insufficient to activate the selector memory cell in the third string of memory cells.

16. The method of claim 15, wherein the selector memory cell in the first string of memory cells and the selector memory cell in the second string of memory cells are respectively a first selector memory cell in the first string of memory cells and a first selector memory cell in the second string of memory cells, wherein the selector memory cell in the third string of memory cells and the selector memory cell in the fourth string of memory cells are respectively a first selector memory cell in the third string of memory cells and a first selector memory cell in the fourth string of memory cells, and further comprising, while applying the first and second activation voltages:
  applying a third voltage to a third selector access line that is commonly coupled to a second selector memory cell in the first string of memory cells and a second selector memory cell in the second string of memory cells, wherein the third voltage activates the second selector memory cell in the first string of memory cells and the second selector memory cell in the second string of memory cells; and
  applying a fourth voltage to a fourth selector access line that is commonly coupled to a second selector memory cell in the third string of memory cells and a second selector memory cell in the fourth string of memory cells wherein the fourth voltage activates the second selector memory cell in the third string of memory cells and the second selector memory cell in the fourth string of memory cells.

17. The method of claim 16, wherein the first selector memory cells in the first and fourth strings of memory cells are erased, wherein the first selector memory cells in the second and third strings of memory cells are programmed, wherein the second selector memory cells in the first and fourth strings are programmed, and the second selector memory cells in the second and third strings are erased.

18. A method of operating a memory device, comprising:
  applying a first activation voltage to a first select line in a first block of memory cells that activates first and second select transistors in the first block of memory cells commonly coupled to the first select line, wherein the first select transistor is coupled to a first string of memory cells in the first block of memory cells and to a first data line and the second select transistor is coupled to a second string of memory cells in the first block of memory cells and to a second data line;
  applying a first voltage to a first selector access line that is commonly coupled to a selector memory cell in the first string of memory cells and a selector memory cell in the second string of memory cells, wherein the first voltage activates the selector memory cell in the first string of memory cells and is insufficient to activate the selector memory cell in the second string of memory cells so that the selector memory cell in the second string of memory cells is deactivated and isolates the second string of memory cells from the second data line, wherein the first string of memory cells is coupled to the first data line through the activated selector memory cell in the first string of memory cells and the activated first select transistor;
  applying a first read voltage to a selected access line in the first block of memory cells commonly coupled a target memory cell in the first string of memory cells and an untargeted memory cell in the second string of memory cells;
  sensing the first data line while the first string of memory cells is coupled to the first data line, while the second string of memory cells is isolated from the second data line, and while applying the first read voltage;
  applying a second activation voltage to a second select line in a second block of memory cells that activates third and fourth select transistors in the second block of memory cells commonly coupled to the second select line, wherein the third select transistor is coupled to a third string of memory cells in the second block of memory cells and to the first data line and the fourth select transistor is coupled to a fourth string of memory cells in the second block of memory cells and to the second data line;
  applying a second voltage to a second selector access line that is commonly coupled to a selector memory cell in the third string of memory cells and a selector memory cell in the fourth string of memory cells, wherein the second voltage activates the selector memory cell in the fourth string of memory cells and is insufficient to activate the selector memory cell in the third string of memory cells so that the selector memory cell in the third string of memory cells is deactivated and isolates the third string of memory cells from the first data line, wherein the fourth string of memory cells is coupled to the second data line through the activated selector memory cell in the fourth string of memory cells and the activated fourth select transistor;
  applying a second read voltage to a selected access line in the second block of memory cells commonly coupled a target memory cell in the fourth string of memory cells and an untargeted memory cell in the third string of memory cells; and
  after sensing the first data line, sensing the second data line while the fourth string of memory cells is coupled to the second data line, while the third string of memory cells is isolated from the first data line, and while applying the second read voltage.

19. The method of claim 18, further comprising charging the first data line before sensing the first data line and leaving the second data line uncharged while sensing the first data line, and charging the second data line before sensing the second data line and leaving the first data line uncharged while sensing the second data line.

20. The method of claim 18, further comprising addressing the target memory cell in the first string of memory cells with a first page address and addressing the target memory cell in the fourth string of memory cells with a second page address different than the first page address.

21. A method of operating a memory device, comprising:
  applying a first voltage to a first selector access line commonly coupled to a first selector memory cell in each of a first string, a second string, a third string, and a fourth string of series-coupled memory cells;
  applying a second voltage to a second selector access line commonly coupled to a second selector memory cell in each of the first string, the second string, the third string, and the fourth string of series-coupled memory cells while applying the first voltage to the first selector access line;
  applying a third voltage to a third selector access line commonly coupled to a third selector memory cell in each of the first string, the second string, the third string, and the fourth string of series-coupled memory cells while applying the first voltage to the first selector access line and the second voltage to the second selector access line; and applying a fourth voltage to a fourth selector access line commonly coupled to a fourth selector memory cell in each of the first string, the second string, the third string, and the fourth string of series-coupled memory cells while applying the first voltage to the first selector access line, the second voltage to the second selector access line, and the third voltage to the third selector access line;

wherein the first voltage activates the first selector memory cell in each of the first string, the second string, the third string, and the fourth string of series-coupled memory cells;

wherein the second voltage activates the second selector memory cell in each of the first string and the third string of series-coupled memory cells and is insufficient to activate the second selector memory cell in each of the second string and the fourth string of series-coupled memory cells so that the second selector memory cell in each of the second string and the fourth string of series-coupled memory cells is deactivated;

wherein the third voltage activates the third selector memory cell in each of the first string, the second string, the third string, and the fourth string of series-coupled memory cells; and wherein the fourth voltage activates the fourth selector memory cell in each of the first string and the second string of series-coupled memory cells and is insufficient to activate the fourth selector memory cell in each of the third string and the fourth string of series-coupled memory cells so that the fourth selector memory cell in each of the third string and the fourth string of series-coupled memory cells is deactivated.

22. The method of claim 21, wherein the first selector memory cell in each of the first string and the third string of series-coupled memory cells is programmed and the first selector memory cell in each of the second string and the fourth string of series-coupled memory cells is erased, wherein the second selector memory cell in each of the first string and the third string of series-coupled memory cells is erased and the second selector memory cell in each of the second string and the fourth string of series-coupled memory cells is programmed, wherein the third selector memory cell in each of the first string and the second string of series-coupled memory cells is programmed and the third selector memory cell in each of the third string and the fourth string of series-coupled memory cells is erased, and wherein the fourth selector memory cell in each of the first string and the second string of series-coupled memory cells is erased and the fourth selector memory cell in each of the third string and the fourth string of series-coupled memory cells is programmed.

23. The method of claim 21, further comprising activating a select transistor coupled between the first string of series-coupled memory cells and a first data line, a select transistor coupled between the second string of series-coupled memory cells and a second data line, a select transistor coupled between the third string of series-coupled memory cells and a third data line, and a select transistor coupled between the fourth string of series-coupled memory cells and a fourth data line while applying the first, second, third, and fourth voltages.

24. The method of claim 23, wherein the activated first selector memory cell, the activated second selector memory cell, the activated third selector memory cell, and the activated fourth selector memory cell in the first string of series-coupled memory cells couple the first string of series-coupled memory cells to the first data line through the activated first select transistor, wherein the second selector memory cell in the second string of series-coupled memory cells that is deactivated isolates the second string of series-coupled memory cells from the second data line, wherein the fourth selector memory cell in the third string of series-coupled memory cells that is deactivated isolates the third string of series-coupled memory cells from the third data line, and wherein the fourth selector memory cell in the fourth string of series-coupled memory cells that is deactivated isolates the fourth string of series-coupled memory cells from the fourth data line.

25. The method of claim 24, further comprising sensing the first data line while the first string of series-coupled memory cells is coupled to the first data line, while applying the first, second, third, and fourth voltages, and while a read voltage is applied to an access line that is commonly coupled to a fifth memory cell in each of the first string, the second string, the third string, and the fourth string of series-coupled memory cells.

26. A memory device, comprising:
first and second blocks of memory cells; and
a controller;
wherein the controller is configured to cause the memory device to sense a target memory cell in the first block of memory cells and a target memory cell in the second block of memory cells concurrently while a read voltage is being applied to a selected access line coupled to the target memory cell in the first block of memory cells and while a read voltage is being applied to another selected access line coupled to the target memory cell in the second block of memory cells;
wherein the target memory cell in the first block of memory cells and a memory cell in the second block of memory cells are each selectively coupled to a first data line; and
wherein the target memory cell in the second block of memory cells and a memory cell in the first block of memory cells are each selectively coupled to a second data line.

27. The memory device of claim 26, wherein the target memory cell in the first block of memory cells is in a first string of series-coupled memory cells in the first block of memory cells, wherein the first string of series-coupled memory cells in the first block of memory cells is coupled to a first select transistor coupled to the first data line, wherein the first data line is coupled to a second select transistor coupled to a first string of series-coupled memory cells in the second block of memory cells, wherein the first string of series-coupled memory cells in the second block of memory cells comprises a memory cell coupled to the access line coupled to the target memory cell in the second block of memory cells and a first selector memory cell, wherein the first selector memory cell is programmed to remain deactivated and thereby isolate the first string of series-coupled memory cells in the second block of memory cells from the first data line when the first and second select transistors are activated and when the target memory cell in the first block of memory cells is being sensed by sensing the first data line.

28. The memory device of claim 27, wherein the target memory cell in the second block of memory cells is in a second string of series-coupled memory cells in the second block of memory cells, wherein the second string of series-coupled memory cells in the second block of memory cells is coupled to a third select transistor coupled to the second data line, wherein the second data line is coupled to a fourth select transistor coupled to a second string of series-coupled memory cells in the first block of memory cells, wherein the second string of series-coupled memory cells in the first block of memory cells comprises a memory cell coupled to the access line coupled to the target memory cell in the first block of memory cells and a second selector memory cell, wherein the second selector memory cell is programmed to remain deactivated and thereby isolate the second string of series-coupled memory cells in the first block of memory cells from the second data line when the first, second, third, and fourth select transistors are activated and when the target memory cell in the second block of memory cells is being sensed by sensing the second data line.

29. The memory device of claim 28, wherein the first string of series-coupled memory cells in the first block of memory cells comprises a third selector memory cell that is coupled to a first selector access line that is coupled to the second selector memory cell in the second string of series-coupled memory cells in the first block of memory cells, wherein the third selector memory cell is erased, and wherein the controller is configured to cause the memory device to apply a voltage to the first selector access line, while the first and second read voltages are being applied, that activates the third selector memory cell and that is insufficient to activate the second selector memory cell.

30. The memory device of claim 29, wherein the first string of series-coupled memory cells in the first block of memory cells comprises a fourth selector memory cell and the second string of series-coupled memory cells in the first block of memory cells comprises a fifth selector memory cell, wherein the fourth and fifth selector memory cells are coupled to a second selector access line, wherein the fourth selector memory cell is programmed and the fifth selector memory cell is erased, and wherein the controller is configured to cause the memory device to apply a voltage, while the first and second read voltages are being applied, to the second selector access line that activates the fourth and fifth selector memory cells.

31. The memory device of claim 30, wherein the second string of series-coupled memory cells in the second block of memory cells comprises a sixth selector memory cell that is coupled to a third selector access line that is coupled to the first selector memory cell in the first string of series-coupled memory cells in the second block of memory cells, wherein the sixth selector memory cell is erased, and wherein controller is configured to cause the memory device to apply a voltage to the third selector access line, while the first and second read voltages are being applied, that activates the sixth selector memory cell and that is insufficient to activate the first selector memory cell.

32. The memory device of claim 31, wherein the second string of series-coupled memory cells in the second block of memory cells comprises a seventh selector memory cell and the first string of series-coupled memory cells in the second block of memory cells comprises a eighth selector memory cell, wherein the seventh and eighth selector memory cells are coupled to a fourth selector access line, wherein the seventh selector memory cell is programmed and the eighth selector memory cell is erased, and wherein the controller is configured to cause the memory device to apply a voltage, while the first and second read voltages are being applied, to the fourth selector access line that activates the seventh and eighth selector memory cells.

33. A memory device, comprising:
first and second blocks of memory cells; and
a controller;
wherein the controller is configured to cause the memory device to apply a first activation voltage to a first select line in the first block of memory cells that activates first and second select transistors in the first block of memory cells commonly coupled to the first select line, wherein the first select transistor is coupled to a first string of memory cells in the first block of memory cells and to a first data line and the second select transistor is coupled to a second string of memory cells in the first block of memory cells and to a second data line;
wherein the controller is configured to cause the memory device to apply a second activation voltage, while the first activation voltage is applied, to a second select line in the second block of memory cells that activates third and fourth select transistors in the second block of memory cells commonly coupled to the second select line, wherein the third select transistor is coupled to a third string of memory cells in the second block of memory cells and to the first data line and the fourth select transistor is coupled to a fourth string of memory cells in the second block of memory cells and to the second data line;
wherein the controller is configured to cause the memory device to couple the first string of memory cells to the first data line while the third string of memory cells is isolated from the first data line and while the first and second activation voltages are applied;
wherein the controller is configured to cause the memory device to couple the fourth string of memory cells to the second data line while the second string of memory cells is isolated from the second data line, while the first and second activation voltages are being applied, while the first string of memory cells is coupled to the first data line, and while the third string of memory cells is isolated from the first data line;
wherein a selector memory cell in the third string of memory cells that is deactivated isolates the third string of memory cells from the first data line and a selector memory cell in the second string of memory cells that is deactivated isolates the second string of memory cells from the second data line.

34. The memory device of claim 33,
wherein the controller is configured to cause the memory device to apply a first read voltage to a selected access line commonly coupled to a target memory cell in the first string of memory cells and to an untargeted memory cell in the second string of memory cells while the first string is coupled to the first data line; and
wherein the controller is configured to cause the memory device to apply, while the first read voltage is applied, a second read voltage to another selected access line commonly coupled to an untargeted memory cell in the third string of memory cells and to a target memory cell in the fourth string of memory cells while the fourth string is coupled to the second data line.

35. The memory device of claim 33,
wherein the controller is configured to cause the memory device to apply a first program voltage to a selected access line commonly coupled to a target memory cell in the first string of memory cells and to an untargeted memory cell in the second string of memory cells while the first string is coupled to the first data line; and
wherein the controller is configured to cause the memory device to apply, while the first program voltage is applied, a second program voltage to another selected access line commonly coupled to an untargeted memory cell in the third string of memory cells and to a target memory cell in the fourth string of memory cells while the fourth string is coupled to the second data line.

36. The memory device of claim 33,
  wherein while the first and second activation voltages are applied, the controller is further configured to cause the memory device to apply a voltage to a first selector access line that is commonly coupled to a selector memory cell in the first string of memory cells and the selector memory cell in the second string of memory cells, wherein the voltage applied to the first selector access line activates the selector memory cell in the first string of memory cells and is insufficient to activate the selector memory cell in the second string of memory cells; and
  wherein while the first and second activation voltages are applied, the controller is further configured to cause the memory device to apply a voltage to a second selector access line that is commonly coupled to the selector memory cell in the third string of memory cells and a selector memory cell in the fourth string of memory cells wherein the voltage applied to the second selector access line activates the selector memory cell in the fourth string of memory cells and is insufficient to activate the selector memory cell in the third string of memory cells.

37. The memory device of claim 36, wherein the selector memory cell in the first string of memory cells is erased, wherein the selector memory cell in the second string of memory cells is programmed, wherein the selector memory cell in the fourth string of memory cells is erased, and wherein the selector memory cell in the third string of memory cells is programmed.

38. A memory device, comprising:
  first and second data lines;
  a first memory block comprising a first string of series-coupled memory cells coupled to a first select transistor coupled to the first data line and a second string of series-coupled memory cells coupled to a second select transistor coupled to the second data line;
  a second memory block comprising a third string of series-coupled memory cells coupled to a third select transistor coupled to the first data line and a fourth string of series-coupled memory cells coupled to a fourth select transistor coupled to the second data line;
  a first selector access line in the first memory block commonly coupled to a first selector memory cell in the first string of series-coupled memory cells and a first selector memory cell in the second string of series-coupled memory cells; and
  a second selector access line in the second memory block commonly coupled to a first selector memory cell in the third string of series-coupled memory cells and a first selector memory cell in the fourth string of series-coupled memory cells;
  wherein the first selector access line is configured to receive a voltage that activates the first selector memory cell in the first string of series-coupled memory cells and that is insufficient to activate the first selector memory cell in the second string of series-coupled memory cells so that the first selector memory cell in the second string of series-coupled memory cells isolates the second string of series-coupled memory cells from the second data line while the first, second, third and fourth select transistors are activated and while the first string of series-coupled memory cells is coupled to the first data line; and
  wherein the second selector access line is configured to receive a voltage that activates the first selector memory cell in the fourth string of series-coupled memory cells and that is insufficient to activate the first selector memory cell in the third string of series-coupled memory cells so that the first selector memory cell in the third string of series-coupled memory cells isolates the third string of series-coupled memory cells from the first data line while the first, second, third and fourth select transistors are activated and while the first string of series-coupled memory cells is coupled to the first data line and the fourth string of series-coupled memory cells is coupled to the second data line.

39. The memory device of claim 38, wherein the first selector cells in the first, second, third, and fourth strings of series-coupled memory cells are not used to store user data or ECC.

40. The memory device of claim 38, further comprising:
  an access line in the first memory block, configured to receive a first read voltage, commonly coupled to another memory cell in the first string of series-coupled memory cells and another selector memory cell in the second string of series-coupled memory cells; and
  an access line in the second memory block, configured to receive a second read voltage, commonly coupled to another memory cell in the third string of series-coupled memory cells and another memory cell in the fourth string of series-coupled memory cells;
  wherein the first and second data lines are configured to be sensed concurrently, while the first string of series-coupled memory cells is coupled to the first data line and the fourth string of series-coupled memory cells is coupled to the second data line, while the first selector memory cell in the second string of series-coupled memory cells isolates the second string of series-coupled memory cells from the second data line, and while the first selector memory cell in the third string of series-coupled memory cells isolates the third string of series-coupled memory cells from the first data line.

41. The memory device of claim 38, further comprising:
  an access line in the first memory block, configured to receive a first program voltage, commonly coupled to an other memory cell in the first string of series-coupled memory cells and an other memory cell in the second string of series-coupled memory cells; and
  an access line in the second memory block, configured to receive a second program voltage, commonly coupled to an other memory cell in the third string of series-coupled memory cells and an other memory cell in the fourth string of series-coupled memory cells;
  wherein the first selector memory cell in the second string of series-coupled memory cells that isolates the second string of series-coupled memory cells from the second data line is configured to maintain a voltage on a channel of the other memory cell in the second string of series-coupled memory cells that inhibits the other memory cell in the second string of series-coupled memory cells from being programmed, and wherein the first selector memory cell in the third string of series-coupled memory cells that isolates the third string of series-coupled memory cells from the first data line maintains a voltage on a channel of the other memory cell in the third string of series-coupled memory cells that inhibits the other memory cell in the third string of series-coupled memory cells from being programmed.

42. The memory device of claim 38, further comprising:
  a third selector access line in the first memory block commonly coupled to a second selector memory cell in the first string of series-coupled memory cells and a second selector memory cell in the second string of series-coupled memory cells; and a fourth selector access line in the second memory block commonly coupled to a second selector memory cell in the third string of series-coupled memory cells and a second selector memory cell in the fourth string of series-coupled memory cells;

wherein the third selector access line is configured to receive a voltage that activates the second selector memory cell in the first string of series-coupled memory cells and the second selector memory cell in the second string of series-coupled memory cells; and wherein the fourth selector access line is configured to receive a voltage that activates the second selector memory cell in the third string of series-coupled memory cells and the second selector memory cell in the fourth string of series-coupled memory cells.

43. An apparatus, comprising:

a block of memory cells comprising a plurality of strings of series-coupled memory cells, wherein each of the strings of series-coupled memory cells comprises a set of dummy memory cells responsive to a set of control signals and a set of data memory cells;

wherein, in response to the set of control signals having a first set of voltages, reading of data memory cells is enabled for only a first portion of the plurality of strings of series-coupled memory cells;

wherein, in response to the set of control signals having a second set of voltages, reading of data memory cells is enabled for only a second portion of the plurality of strings of series-coupled memory cells; and wherein, in response to the set of control signals having a third set of voltages, reading of data memory cells is enabled for the first portion and the second portion of the plurality of strings of series-coupled memory cells.

44. The apparatus of claim 43, further comprising:

wherein, in response to the set of control signals having a fourth set of voltages, reading of data memory cells is enabled for only a third portion of the plurality of strings of series-coupled memory cells; and wherein, in response to the set of control signals having the third set of voltages, reading of data memory cells is enabled for the first portion, the second portion and the third portion of the plurality of strings of series-coupled memory cells.

45. The apparatus of claim 43, further comprising:

wherein the first portion of the plurality of strings of series-coupled memory cells are contained within a first contiguous set of strings of series-coupled memory cells of the plurality of strings of series-coupled memory cells; and wherein the second portion of the plurality of strings of series-coupled memory cells are contained within a second contiguous set of strings of series-coupled memory cells of the plurality of strings of series-coupled memory cells.

46. The apparatus of claim 45, wherein the first portion of the plurality of strings of series-coupled memory cells comprises every other string of series-coupled memory cells contained within the first contiguous set of strings of series-coupled memory cells, and wherein the second portion of the plurality of strings of series-coupled memory cells comprises every other string of series-coupled memory cells contained within the second contiguous set of strings of series-coupled memory cells.

47. The apparatus of claim 43, wherein a string of series-coupled memory cells of the first portion of the plurality of strings of series-coupled memory cells is interposed between strings of series-coupled memory cells of the second portion of the plurality of strings of series-coupled memory cells.

* * * * *